US011552043B2

(12) United States Patent
Sen et al.

(10) Patent No.: US 11,552,043 B2
(45) Date of Patent: Jan. 10, 2023

(54) POST BOND INSPECTION OF DEVICES FOR PANEL PACKAGING

(71) Applicant: PYXIS CF PTE. LTD., Singapore (SG)

(72) Inventors: Amlan Sen, Singapore (SG); Chian Soon Chua, Singapore (SG); Wai Hoe Lee, Singapore (SG); Qing Feng Guan, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 0 days.

(21) Appl. No.: 17/138,782

(22) Filed: Dec. 30, 2020

(65) Prior Publication Data

US 2021/0118841 A1    Apr. 22, 2021

Related U.S. Application Data

(63) Continuation-in-part of application No. 16/814,961, filed on Mar. 10, 2020.

(30) Foreign Application Priority Data

Mar. 27, 2019  (SG) .......................... 10201902757X

(51) Int. Cl.
*H01L 21/68*     (2006.01)
*H01L 23/00*     (2006.01)

(52) U.S. Cl.
CPC ............ *H01L 24/80* (2013.01); *H01L 21/681* (2013.01); *H01L 2224/80132* (2013.01)

(58) Field of Classification Search
CPC ............. H01L 23/544; H01L 21/67144; H01L 21/681; H01L 21/4853; H01L 22/20; H01L 23/49838; H01L 2223/54426; H01L 2221/68318; H01L 21/67242; H01L 21/6836; H01L 23/5389; H01L 2221/68381; H01L 2221/68309; H01L 2221/68327; H01L 21/6835; H01L 21/568; H01L 24/75; H01L 21/50
USPC .............................................................. 438/5
See application file for complete search history.

(56) References Cited

U.S. PATENT DOCUMENTS

| 9,704,822 B2 * | 7/2017 | Knickerbocker | ....... H01L 24/81 |
| 10,269,611 B1 * | 4/2019 | Tsai | .......................... H01L 22/12 |
| 2019/0304852 A1 * | 10/2019 | Seyama | ................... H01L 22/12 |

* cited by examiner

*Primary Examiner* — Vu A Vu
(74) *Attorney, Agent, or Firm* — Javalon Law, PC

(57) ABSTRACT

Panel level packaging (PLP) with high accuracy and high scalability is disclosed. The PLP includes dies bonded face down onto an alignment carrier configured with die bond regions. Pre-bond and post bond inspection are performed at the carrier level to ensure accurate bonding of the dies to the carrier.

20 Claims, 26 Drawing Sheets

505

525

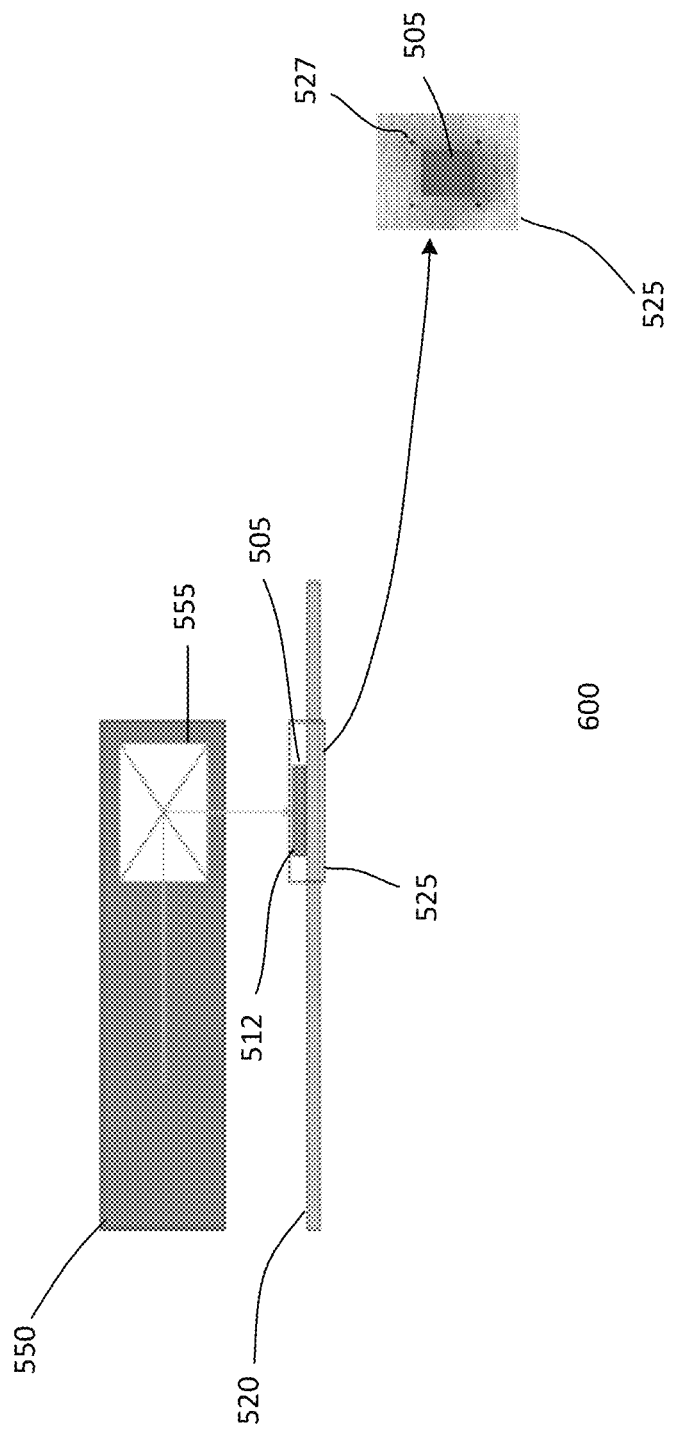

525

POST BOND INSPECTION OF DEVICES FOR PANEL PACKAGING

CROSS-REFERENCE TO RELATED APPLICATIONS

This application is a continuation-in-part of U.S. patent application Ser. No. 16/814,961, filed on Mar. 10, 2020, which claims the benefit of S.G. Provisional Application No. 10201902757X, filed on Mar. 27, 2019, the disclosure of all of which are herein incorporated by reference in their entireties for all purposes.

FIELD OF THE INVENTION

The present disclosure relates to packaging of devices. In particular, the present disclosure relates to post bond inspection of devices for panel level packaging.

BACKGROUND

Panel level packaging (PLP) of devices have garnered significant interest in recent years. This is due to the larger volume of dies which can be packaged in parallel compared to conventional wafer level or substrate level packaging techniques. PLP involves attaching or bonding individual dies on a large panel or carrier for die bonding. For example, the dies are arranged in a matrix on the carrier, with rows and columns of dies. The carrier, depending on its size, can accommodate significantly more dies than on a wafer, for example, 3 times to 5 times or more dies than a wafer. This increases packaging throughput as well as reduces costs.

An important consideration in PLP is the precise positioning of the die on the carrier after bonding to the carrier to ensure that the die is accurately bonded at a target location. In the case of face-down bonding process in which the active surface of the die includes die patterns or fiducials, such as die contact pads, are bonded to the surface of the carrier, post bond inspection poses challenges. With face-down bonded dies, the fiducials on the active surface of the dies are no longer visible to the cameras of the bonding tool.

Conventional post bond inspection of face-down bonded dies requires the use of x-ray inspection systems in the case of a substrate carrier, short wave infra-red (SWIR) inspection systems in the case of a steel carrier, or flipping a carrier over for inspection in the case of a glass carrier. In the case of x-ray and SWIR systems, they are very costly. For all the other cases, they require the removal of the carrier from the bonder (e.g., not real-time or off-line). Removing the carrier from the bonder is time-consuming and may also cause damage to the bonded dies on the carrier.

Therefore, based on the foregoing discussion, it is desirable to provide a cost-effective in-line post bond inspection for PLP to ensure high bonding accuracy and high yields.

SUMMARY

Embodiments of the present disclosure generally relate to devices. In particular, the present disclosure relates to die bonding using an alignment carrier. The alignment carrier may be employed for die bonding of single die packages or multiple die packages, such as multi-chip modules (MCMs). The die bonding is facilitated by a die bonding tool with a camera or an alignment module configured to align dies for bonding onto the alignment carrier.

In one embodiment, a method for post bond inspection includes providing a carrier with die bond regions including local carrier fiducials from which a target bond position of the die bond region is derived, providing a selected die for bonding to a selected die bond region of the die bond regions on the carrier. An active surface of the selected die is bonded to the selected die bond region. The method further includes aligning the selected die to the target bond position on the selected die bond region including determining the target bond position based on local carrier fiducials of the selected die bond region, determining a die reference point on the active surface of the selected die, determining a reference point offset for the die reference point, and aligning the die reference point to the target bond position. The method also includes bonding the selected die (bonded die) to the die bond region after the selected die is aligned to the target bond position and performing a post bond inspection on the bonded die. The post bond inspection includes determining the target bond position based on the local carrier fiducials of the selected die bond region, determining a post bond die reference point based on a bonded position of the die (bonded die position) and the reference point offset, and determining if the post bond die reference point is aligned to the target bond position.

In another embodiment, a post bond inspection system for a die bonder includes an integrated camera module configured to view downwards in a vertical direction for detecting local carrier fiducials of a selected die bond region of an alignment carrier when the alignment carrier is mounted on a base assembly of the die bonder, the alignment carrier includes die bond regions and each die bond region includes local carrier fiducials from which a target bond position is determined, and to view upwards in the vertical direction for viewing an active (bottom) surface including die fiducials of a selected die, and a die reference point is determined from the die fiducials. The system includes a processor, the processor receives input from the camera module, the processor is configured to perform an inspection including a post bond inspection which includes determining the target bond position based on the local carrier fiducials of the selected die bond region, retrieving, from a memory storage, a reference point offset determined for the die reference point during die aligning, deriving a post bond die reference point based on a bonded position of the die (bonded die position) and the reference point offset, and determining if the post bond die reference point is aligned to the target bond position.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 6a-b are simplified illustrations of embodiments of a post bond inspection by the die bonder;

DETAILED DESCRIPTION

Embodiments generally relate to devices, for example, semiconductor devices or integrated circuits (ICs). In particular, the present disclosure relates to die bonding of devices using an alignment carrier or panel. The alignment carrier may be employed for die bonding of single die packages or multiple die packages, such as multi-chip modules (MCMs). The die bonding is facilitated by a die bonding tool (die bonder) with a camera or an alignment module configured to align dies for bonding onto the alignment carrier. Furthermore, in-line post bond inspection of bonded dies is performed, resulting in high bonding accuracy with high throughput time without causing damage to dies due to handling when using off-line post bond inspection.

Figure 1:
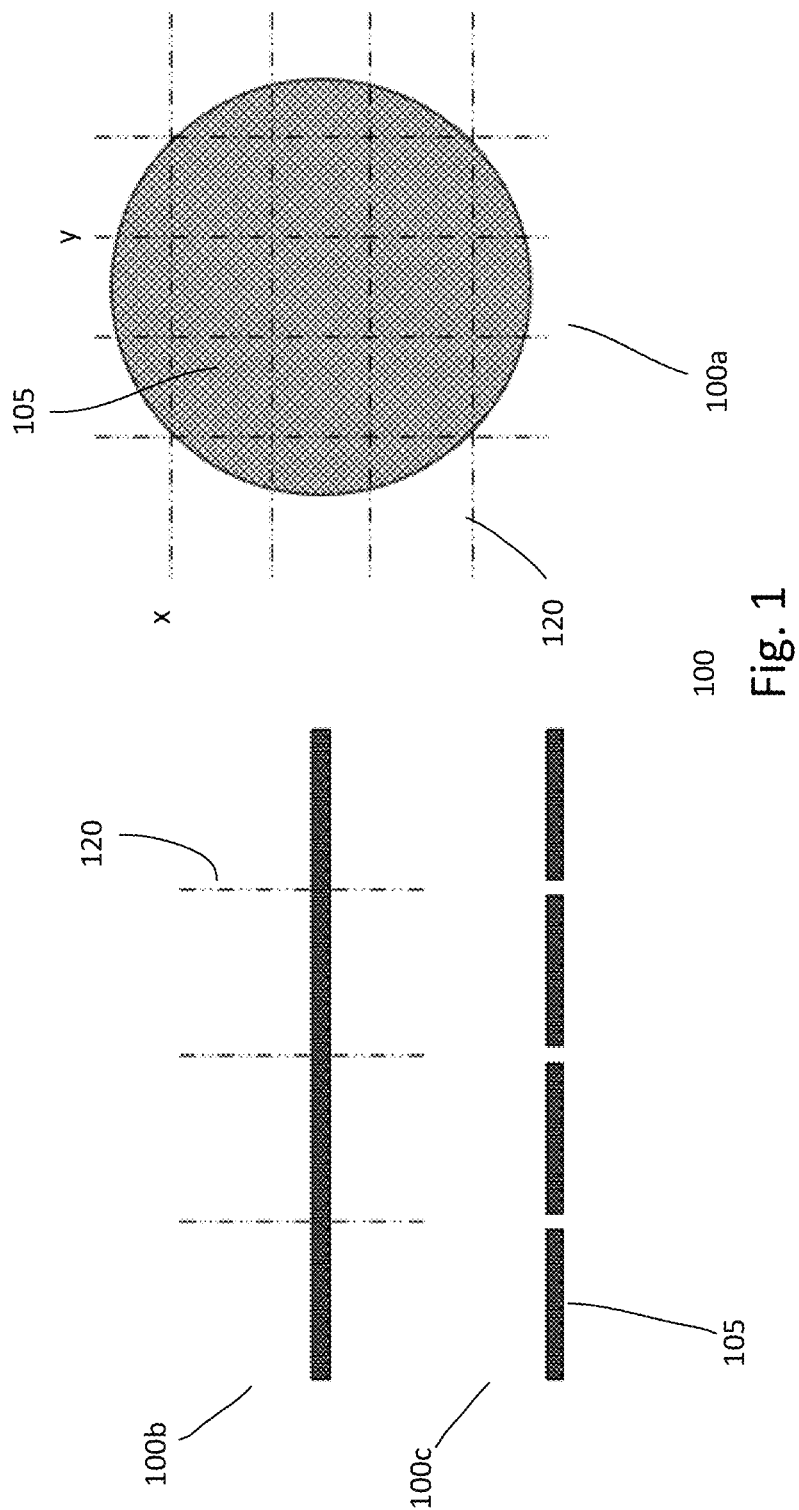
FIG. 1 shows various views of a semiconductor wafer.

FIG. 1 shows simplified views of a semiconductor wafer 100. For example, a top view 100a and side views 100b-c of the wafer are shown. The wafer may be a lightly doped p-type silicon wafer. Other types of wafers may also be employed. A plurality of devices 105 is formed on an active surface of the wafer. For example, the active surface may be the top surface of the wafer while the inactive surface may be the bottom surface. The devices are arranged in rows along a first (x) direction and columns along a second (y) direction. After processing of the wafer is completed, the wafer is diced along the dicing lines 120 in the x and y directions to singulate the devices into individual dies 105, as indicated by the side view 100c.

Processed wafers may be incoming processed wafers from an external supplier. For example, a packaging vendor may receive the processed wafers. The processed wafers may be diced into individual dies for packaging using alignment carriers and die bonding tools fitted with alignment modules to align dies for die bonding onto the alignment carriers. A die includes top and bottom surfaces. The top or active surface includes die pattern features, such as die pads as well as other features.

Figure 2:
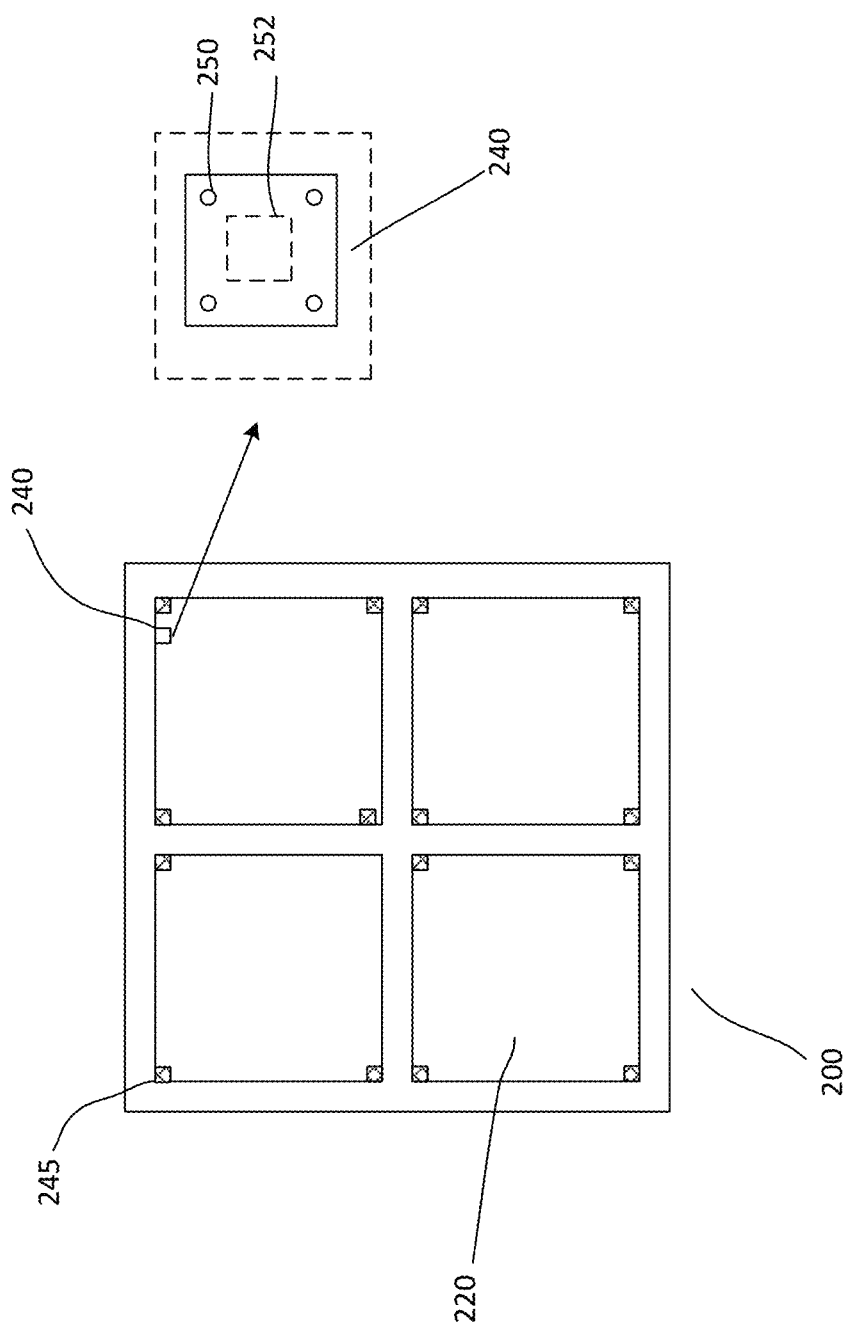
FIG. 2 shows a simplified top view of an embodiment of an alignment carrier for die bonding.

FIG. 2 shows a simplified top view of an embodiment of an alignment carrier 200. The alignment carrier is configured for die bonding, such as attaching dies thereto. As shown, the alignment carrier is a rectangular-shaped carrier. Other shaped carriers may also be useful. In a preferred embodiment, the alignment carrier is formed of a material having a low coefficient of expansion (CTE) to minimize linear variation during temperature changes. The alignment carrier, for example, may be formed of a material having a CTE at or below 8. Furthermore, the material should be robust enough to withstand the handling during the bonding process. In addition, the material should preferably be magnetic, enabling the alignment carrier to be held firmly during grinding processes which are part of the overall bonding process. For example, the low CTE material may include, for example, Alloy 42 (CTE3-4.5) and Alloy 46 (CTE7-8). Other types of low CTE materials may also be used to form the alignment carrier. Forming the alignment carrier using other materials as well as materials with other CTEs, including those having a CTE above 8 may also be useful. The size of the alignment carrier may be as large as 700 mm×700 mm. Providing alignment carriers having other sizes may also be useful.

The alignment carrier, in one embodiment, includes die bond regions 240. A die bond region is configured to accommodate a die for die bonding. For example, each die bond region of the alignment carrier is configured to accommodate a die for die bonding. In one embodiment, a die bond region includes local carrier alignment marks or carrier fiducials 250 for aligning a die to a die attach region 252. For example, each die bond region includes its own local carrier fiducials for attaching a die thereto. The die attach region is the region of the die bond region on which the die is attached. As shown, a local carrier fiducial has a circular shape. Other shapes for a local carrier fiducial may also be useful. Preferably, all local carrier fiducials have the same shape.

In one embodiment, a die bond region includes at least two local carrier fiducials. Providing other numbers of local carrier fiducials greater than two may also be useful. For example, the die bond region may include 2 to 4 local carrier fiducials. Providing other numbers of local carrier fiducials, including more than four local carrier fiducials may also be useful. As shown, the die bond region includes 4 local carrier fiducials. The local carrier fiducials, for example, are located on the corners of the die bond region, forming corners of a rectangle. Other configurations of the local carrier fiducials may also be useful.

Figure 3:
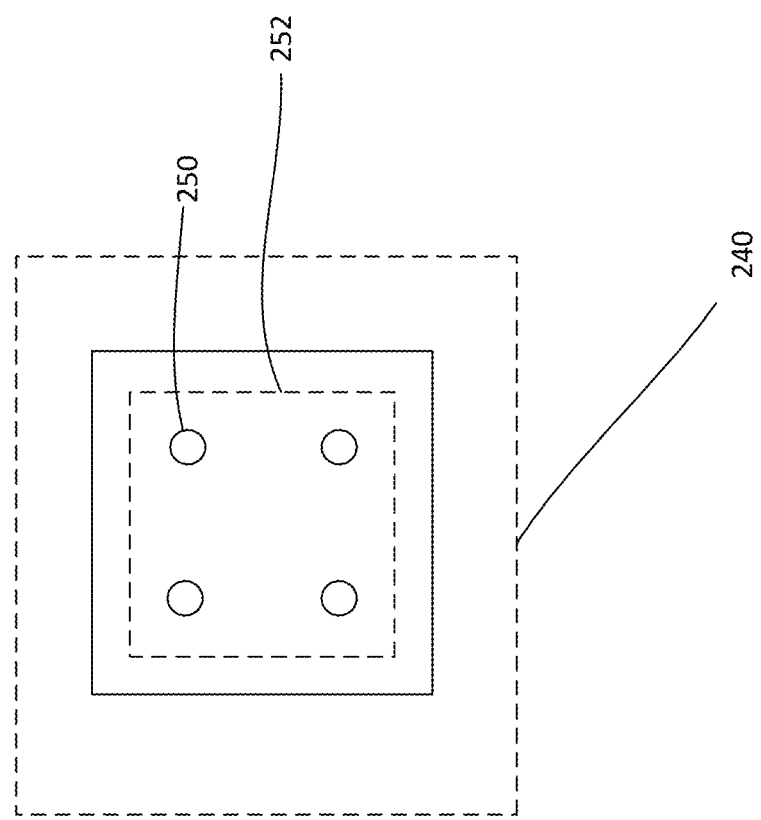
FIG. 3 shows another embodiment of a die bond region of an alignment carrier.

The local carrier fiducials, in one embodiment, are preferably located outside of the die attach region. For example, the local carrier fiducials, as shown, surround the die attach region. In some cases, local carrier fiducials are disposed within the die attach region, as shown in FIG. 3. In such cases, the local carrier fiducials are not visible after die bonding since the die will cover them up. In other embodiments, the local carrier fiducials may be disposed both within and outside of the die attach region. Providing the local carrier fiducials outside of the die attach region advantageously facilities post bond inspection since they are visible after die bonding. Referring back to FIG. 2, the die bond region may be configured to accommodate a single die or multiple dies, such as a multi-chip module (MCM) application. In the case of an MCM application, providing local carrier fiducials outside the die attach region advantageously enables an alignment mark to serve as a common local carrier alignment mark for bonding multiple dies onto the die bond region. If local carrier fiducials are disposed within the die attach region of one of the dies, additional local carrier fiducials may be provided for die bonding of other dies of the MCM.

In one embodiment, the local carrier fiducials are configured for detection by a collinear vision camera for alignment. The local carrier fiducials may be formed on the die bond regions of the alignment carrier using, for example, laser drilling. Other techniques for forming the local carrier fiducials may also be useful. Preferably, the local carrier fiducials are shallow alignment marks which facilitate removal by grinding for recycling of the carrier. For example, local carrier fiducials may be removed and new ones are formed for die bonding of another or a different type of die, such as when a die is no longer in production.

Providing local carrier fiducials for each die bond region improves the positional accuracy of die bonding for each die bond region, as compared to calculating die bond positions based on global alignment marks, as is conventionally done. Furthermore, by providing local carrier fiducials, effects of carrier distortion or other positioning errors are minimized, improving positional accuracy of dies on the alignment carrier, thereby improving yield and scalability.

The die bond regions of the alignment carrier may be configured in a matrix format, with rows and columns of die bond regions in first and second directions. For example, the die bond regions 240 are arranged in a matrix format, each configured to accommodate a die. The alignment carrier may include at least two designated alignment die bond regions 245. For example, the alignment carrier may include 2 to 4 alignment die bond regions. Providing other numbers of alignment die bond regions may also be useful. The alignment die bond regions may be located at corners of the matrix of die bond regions. Other configurations of alignment die bond regions may also be employed.

An alignment die bond region is similar to other die bond regions of the carrier, except that an alignment die bond region is designated for an alignment die. For example, an alignment die is die bonded to an alignment die bond region. An alignment die may be a normal or live die, such as dies bonded in the other die bond regions of the carrier. Live or normal dies are packaged and sold to customers and into products. For example, an alignment die may be a live die which is also used for alignment purposes.

In other cases, an alignment die may be specifically configured for alignment purposes. Providing specific alignment dies may be advantageous as they can be easily distinguished from normal or live dies. In such cases, alignment dies are not for normal use. Preferably, the top of an alignment die is processed with features which are easily detectable by the alignment camera. This produces contrast in the alignment image, making it easy to detect. Other types of alignment dies are also useful. Alignment dies may be processed on the same wafer as the normal dies or on different wafers.

In one embodiment, the alignment carrier may be divided or segmented into die bond region blocks 220. The blocks, for example, are distinct blocks, with a space separating adjacent blocks. In some embodiments, the blocks may not be distinct blocks. For example, the die bond regions may be divided into blocks which are not separated by spaces. For example, the blocks may appear to be a continuous matrix of die bond regions.

A block is configured to accommodate a plurality of dies for die bonding. Segmenting the alignment carrier into blocks is advantageous as this segments the alignment carrier into smaller dimension blocks to reduce displacement errors caused by large carriers. For example, the blocks provide a large carrier with the advantage of scale while retaining the advantages from smaller sized carriers. As shown, the alignment carrier is divided into 4 panel blocks. Dividing the alignment carrier into other numbers of blocks may also be useful. For a 600 mm×600 mm alignment carrier, the blocks may be about 270 mm×270 mm. Preferably, the blocks are configured to be the same size blocks. Other numbers of blocks and block sizes may also be useful. The number of blocks and block sizes may depend on different factors, such as material, size of the alignment carrier, and process conditions. The size of the block should be selected to effect high processing yields while maintaining the advantage of scale.

A block, in one embodiment, includes at least one alignment die bond region 245 for bonding an alignment die thereto. Providing more than one alignment die bond region may also be useful. For example, a block may include 1 to 4 or more alignment die bond regions. An alignment die bond region may preferably be disposed at a corner position of the block. For example, alignment die bond regions may be disposed at the 4 corners of the block or 1 to 3 corners of the blocks. Locating alignment die bond regions at other positions of the block may also be useful. The more alignment die bond regions there are, the more accurate the die bonding process. However, it may be at the cost of a lower number of die outputs per alignment carrier, in the case where alignment dies are specifically for alignment purposes, since more die bond regions are assigned to alignment dies. In some embodiments, adjacent blocks may share alignment die bond regions. For example, in the case where a block is provided with one alignment die bond region, it can share a second alignment die bond region from an adjacent block. Other configurations of sharing alignment die bond regions between blocks may also be useful.

An alignment die serves as a further reference point for each block. Providing blocks with alignment dies enables linear and non-linear errors occurring in downstream processes, such as molding, to be reduced to fractions. For example, linear and non-linear positioning errors are reduced significantly. In addition, the alignment die serves as an origin reference for each die within a block.

As described, the alignment carrier is formed of a metallic material with local carrier alignment marks or carrier fiducials. The use of a metallic material is advantageous as it allows a magnetic table to be used to hold the carrier firmly in place for processing. For example, a magnetic table may be employed to firmly hold the carrier in place for grinding the mold compound.

In other embodiments, the alignment carrier may be formed of glass or other types of transparent material. The local carrier fiducials may be formed on the transparent carrier. In other cases, the local carrier fiducials may be independent of a transparent carrier, such as a glass carrier. For example, local carrier fiducials may be formed on a separate mark sheet, such as paper or resin, and may be attached to the bottom or inactive surface of the transparent carrier. The adoption of the independent local carrier fiducials eliminates the need for a marking process on the carrier, and thus reduces manufacturing cost significantly. Light from a camera module of a die bonder can penetrate through the transparent carrier to detect the local carrier fiducials on the mark sheet. The adoption of the independent local carrier fiducials can be achieved easily and eliminates the need for the marking process on the carrier. Furthermore, providing local carrier fiducials independent of a transparent carrier is advantageous since it avoids the need to mass-produce glass carriers with local carrier fiducials. This can result in significant savings since glass carriers are fragile and the marking process is expensive.

To facilitate die bonding, an adhesive tape may be used. For example, an adhesive tape may be applied on the active surface of the alignment carrier. For example, the tape covers the active surface, including the local carrier fiducials and die bond regions. The tape, in one embodiment, is a thermal release tape. Other types of tapes may also be used to facilitate die bonding. The tape should be sufficiently transparent to enable an alignment unit of a bond module with cameras to detect the alignment marks for aligning the die to the alignment carrier. For example, the tape may be semi-transparent to enable the light of the alignment unit to penetrate through the tape to detect the local carrier fiducials. In one embodiment, the cameras of the alignment unit are configured to image the carrier alignment marks on the alignment carrier vertically downwards as well as upwards to image the bonding surface of the die for accurate bonding of the die to the die bond region of the alignment carrier. In addition, the stickiness of the tape should be strong enough to hold the dies in position once aligned and placed thereon by a die bonder. After applying the tape, the alignment carrier is ready for die bonding.

Figure 4A:
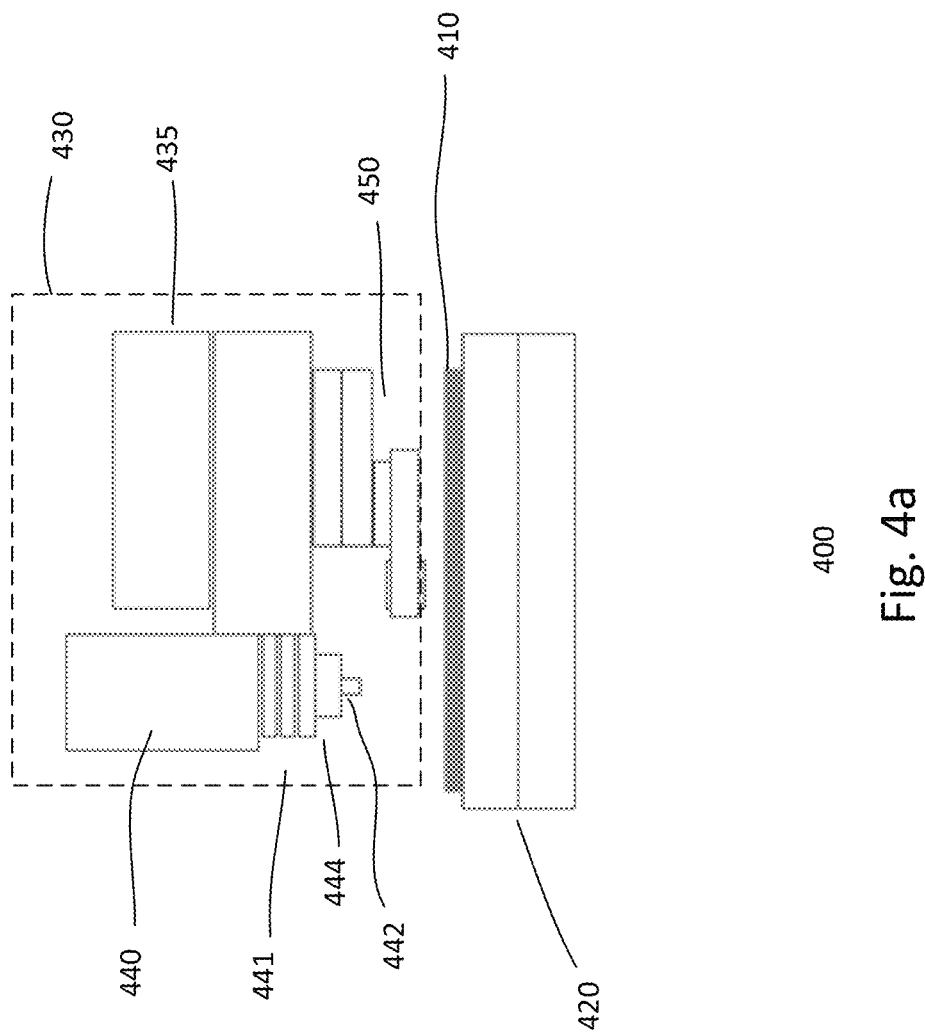
FIG. 4a shows a simplified side view of an embodiment of a die bonder.

FIG. 4a shows a simplified diagram of an embodiment of a die bonder 400. As shown, the die bonder includes a base assembly 420 for supporting an alignment carrier 410. For example, the base assembly is configured to hold an alignment carrier 410 for bonding. The die bonder includes a bonding assembly 430 mounted on a support or gantry assembly 435. The bonding assembly, for example, is positioned above the base assembly. The bonding assembly includes a bonding head 441 and a bonding assembly actuator 440. The bonding assembly actuator is configured to move the bonding head in a z-direction (e.g., vertical direction) towards or away from the alignment carrier. The bonding head includes a bonding head actuator 444 and a bonding tool (bonder) 442. The bonding head actuator controls the bonder to pick up or release a die.

The support or gantry assembly is configured for actuating the bonding assembly to position the bonding head at successive die bond regions on the alignment carrier. For example, the support assembly includes a support alignment assembly which is configured to align the bonding head in an x-y plane for positioning the bonding head at successive die bond regions for die bonding. For example, the support alignment assembly may perform coarse alignment of the bonding head to the die bond region for die bonding. After the coarse alignment, the support alignment assembly performs fine alignment of the bonding head to bond the die to the die attach region of the die bond region. Coarse alignment may include moving the bonding head in the x and/or y directions to the die bond region while fine alignment may include moving the bonding head in the x and/or y directions as well as rotating the die along the x-y plane by the die bonder.

In one embodiment, the support alignment assembly includes an x-axis actuator, a y-axis actuator, and an angular (θ) actuator for performing the planar motion along the horizontal x-y plane and/or angular motion about an axis of the bonding head to facilitate course and fine alignments. The coarse and fine alignment may be performed continuously or discontinuously. For example, continuous coarse and fine alignments may be in the case when they are both performed after picking up a die by the bonding head from a feeder assembly (not shown); discontinuous coarse and fine alignment may be when course alignment is performed prior to picking up the die by the bonding head and fine alignment is performed afterwards.

To facilitate alignment of the die to the die bond region, the bonding assembly includes an integrated camera module 450. For example, the camera unit extends to image the die bond region on the alignment carrier and the die on the bonder 442 of the bonding head 441. Coarse alignment may be performed with or without the use of the camera module. For example, positions of the die bond regions may be roughly or coarsely determined based on an alignment die bond region or position. Alternatively, coarse alignment may be determined by using the camera module. As for fine alignment, it is facilitated by the camera module. For example, the camera module may be employed for pre-alignment inspection for alignment and bonding the die to the die bond region as well as post bond inspection after the die is bonded to the die bond region.

The camera unit includes cameras and light sources for emitting light for image capturing. The light sources, for example, are capable of emitting light that can penetrate through the adhesive layer on the carrier to identify local carrier fiducials by the camera module to align a die to the die attach region of the die bond region by moving the bonding head. For example, the light source or sources may generate light having a wavelength of about 600 nm to penetrate the adhesive tape. Other wavelengths which may penetrate the adhesive tape may also be useful. In one embodiment, the camera module includes a lookdown (bottom) camera for viewing the alignment carrier.

The light also enables the camera module to view the die on the bonding head, enabling alignment of the die to the die attach region by rotating the die in the x-y plane. For example, the camera captures the image of a target bond position on the die attach region as well as an image of the die. In one embodiment, the camera module includes a lookup (top) camera for viewing the die surface. A die bonder controller computes the offset values with respect to the target bond position in the x and y directions as well as the angle in the x-y plane. Once calculated, the controller adjusts the bonding head accordingly for placement of the die on the target bond position of the die attach region.

The present system can accommodate attaching a die on the carrier using the active or non-active surface. For example, the die can be attached to the alignment carrier in a face-up or face-down configuration. Face-up, for example, refers to the inactive surface of the die being attached to the alignment carrier while face-down refers to the active surface of the die being attached to the alignment carrier. For face-down configurations, a transparent layer, such as ABF, may be applied on the active surface of the die. This enables the camera module to further utilize features on the die to serve as alignment features or fiducials. For example, the lookup camera may view the features of the active surface of the die to serve as die alignment marks or die fiducials. In some cases, an inactive surface of the die may be processed to include alignment features for the lookup camera to detect. By using the lookup camera, the die bonder can improve accuracy by adopting a cluster of multiple features on the bottom or bonding surface of the die.

As discussed, the die bonder is configured with one bonding assembly with a die bonding head. To increase throughput, the die bonder may be configured with multiple die bonding assemblies mounted onto a support assembly. For example, the die bonder may be configured with 4 or 6 bonding assemblies for bonding multiple dies in parallel on an alignment carrier. In some cases, multiple alignment carriers may be die bonded in parallel using multiple bonding assemblies. The individual bonding assemblies may be configured to operate independently of each other. For example, each bonding assembly includes its respective support assembly and camera module for independent alignment of the die to the die attach region.

Also as described, the support alignment assembly performs both coarse and fine alignments. In some embodiments, the base assembly may include a translatable table for performing coarse alignment of the carrier while the support alignment assembly performs fine alignment. Other configurations of aligning the bonding head to the bonding region (or die bond region) on the alignment carrier may also be employed.

Figure 4B:
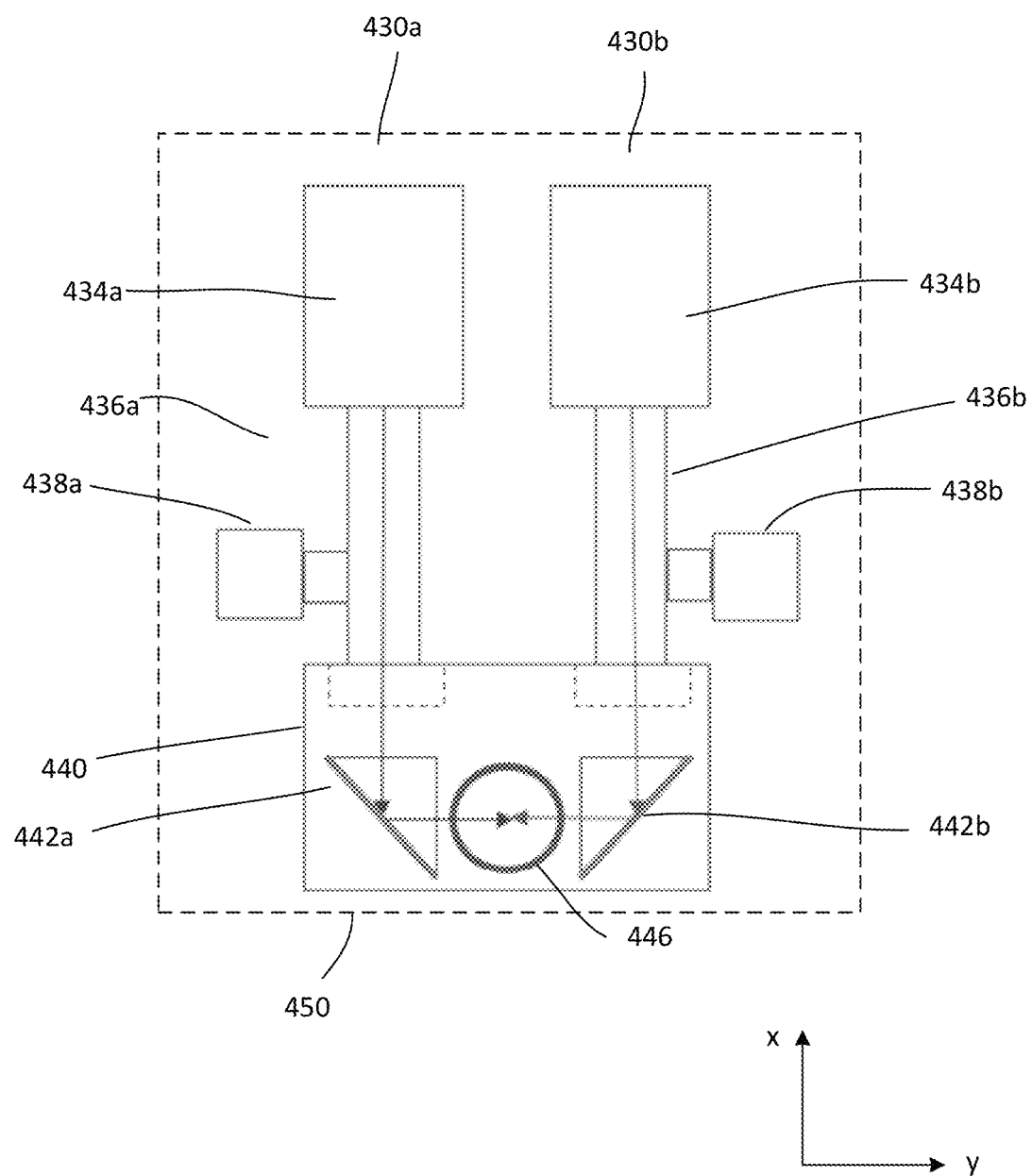
FIGS. 4b-c show simplified top and side views of an embodiment of a camera unit of the die bonder.
Figure 4C:
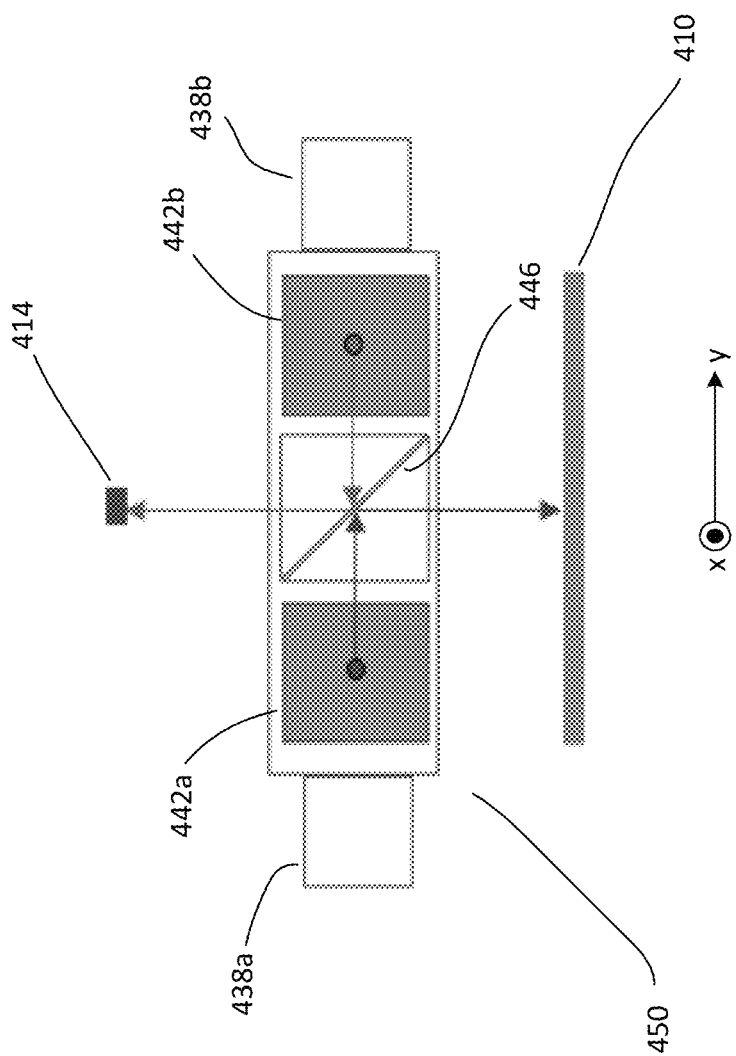

FIGS. 4b-c show different simplified views of an embodiment of a camera unit 450. For example, FIG. 4b shows a top view of the camera unit while FIG. 4c shows a side view of the camera unit. The side view of the camera unit shown in FIG. 4c, for example, may be viewed from the front or from the x direction.

The camera unit includes first and second integrated alignment camera subunits 430a and 430b. The integrated camera subunits are high resolution collinear camera subunits, one for viewing the alignment carrier 410 and the other for viewing the die 414. For example, the first camera subunit (lookdown) 430a is configured to view or image the alignment carrier while the second camera subunit (lookup) 430b is configured to view or image the die in an optical deflector subunit 440. As shown, the camera subunits are disposed side-by-side in the x-y plane. An integrated camera subunit includes a collinear camera (434a or 434b) coupled to a high-resolution lens (436a or 436b). A light source (438a or 438b) is configured to emit light capable of penetrating the adhesive tape covering the alignment marks on the carrier. For example, the light source may generate light at a wavelength of 600 nm. Other wavelengths which are sufficient to penetrate the adhesive tape or transparent dielectric layer may also be useful.

The light is passed to the reflector subunit 440. The reflector subunit is configured to reflect light from the first light source 438a via a first reflector or mirror 442a to a prism 446 which further reflects the light from the first light source downwards to the carrier (lookdown camera), while the light from the second light source 438b is reflected from the second reflector or mirror 442b to the prism 446 and further upwards to the die (lookup camera). This enables the camera unit to capture images from both the die and die attach region on the carrier, giving it a direct line of sight for alignment.

As discussed, the camera module utilizes simultaneous recognition of the die and local carrier alignment marks on the alignment carrier using lookup and lookdown cameras. The ability to simultaneously recognize both alignment marks on the alignment carrier and the die imparts high accuracy in die bonding. Furthermore, by configuring the cameras of the camera unit in the x-y plane (horizontal plane or side-by-side), the integrated camera module is a compact module in the z or vertical direction. This advantageously decreases the movement of the bonding head to the carrier along the vertical distance between the bonding head and the alignment carrier, enhancing throughput.

Figure 5A:
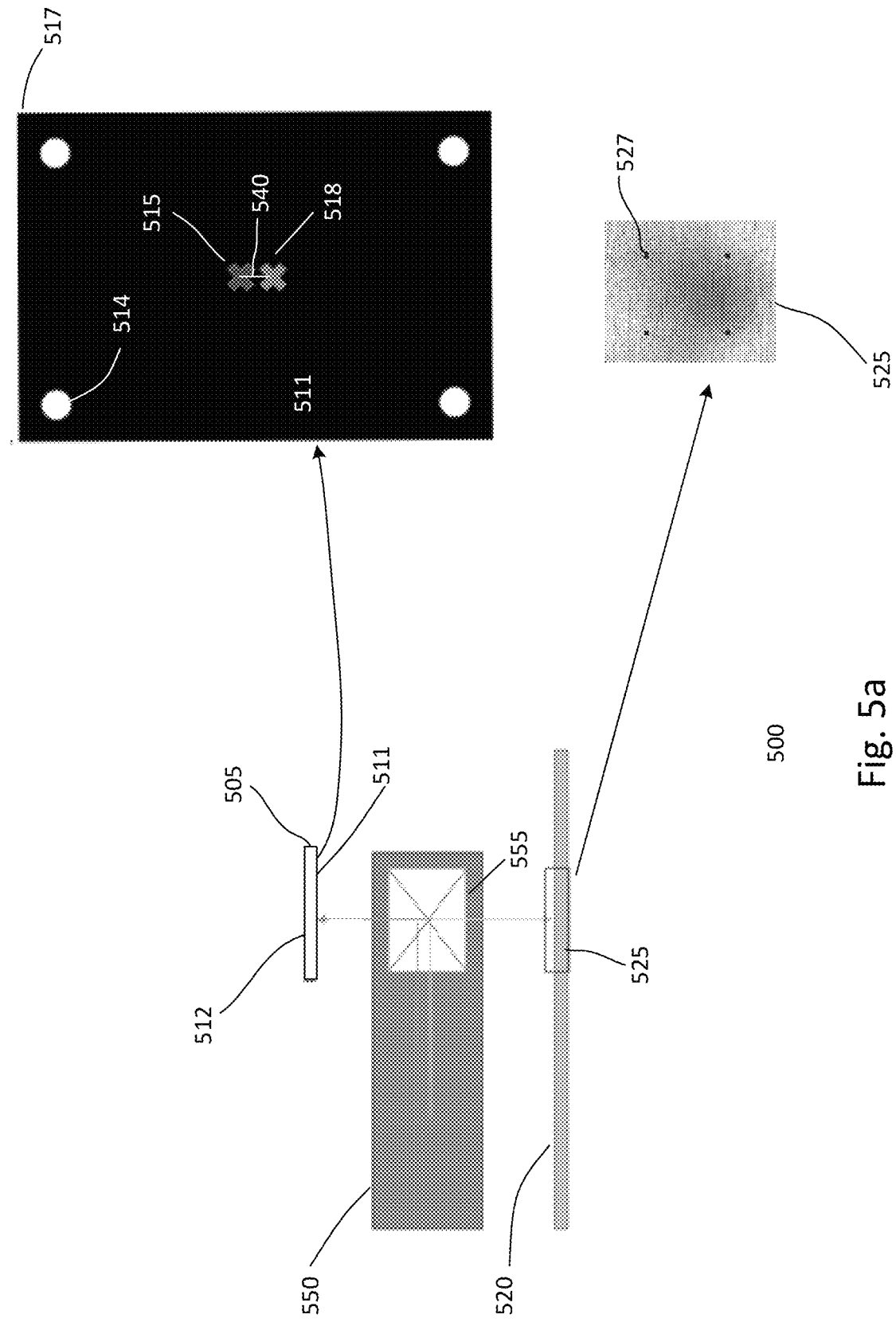
FIG. 5a is a simplified illustration of a pre-alignment inspection by the die bonder.

FIG. 5a is a simplified illustration of a pre-alignment inspection 500 by the die bonder. A die 505 is inspected for pre-alignment for bonding onto a die bond region 525 of an alignment carrier 520. In one embodiment, the die is configured for bonding face-down onto the alignment carrier. For example, a bottom surface 511 of the die which is bonded to the surface of the alignment carrier is the active surface. A die is picked up by the bonder from a die feeder. For example, a top surface 512 of the die is picked up. The top surface, in one embodiment, is the inactive surface of the die. The die feeder retracts and the camera module extends into position for pre-alignment inspection of the die for bonding to the die bond region 525.

The pre-alignment inspection, in one embodiment, includes inspecting the bottom of the die and the die bond region of the carrier. For example, the camera module 550 is configured to inspect the bottom die surface using a lookup camera and the die bond region on the alignment carrier using the lookdown camera. In one embodiment, a prism 555 directs light onto the bottom die surface and to the surface of the die bond region, capturing images of the bottom die surface 511 and surface of the die bond region 525.

With respect to the pre-alignment inspection by the lookup camera, first die alignment marks or die fiducials 514 on the bottom surface of the die are identified. The first die fiducials, for example, are features on the active die surface. Illustratively, the first die fiducials include four first die fiducials disposed near the corners of the die and have circular shapes, such as vias. Other positions, shapes and numbers of fiducials may also be useful. The position and shape of the first die fiducials may depend on, for example, the die layout and type of features used. The first die fiducials may be referred to as die pattern fiducials. The coordinates of the first die fiducials may be provided by a customer of the dies. For example, the x and y coordinates of the first die fiducials may be provided in an e-file. The e-file may be used by the die bonder for alignment.

Based on the first die fiducials, a first die reference point 515 is generated. The first die reference point may be referred to as a die pattern reference point. The first die reference point may be defined by a first die reference point coordinates (x, y) (e.g., reference point I (x, y)). The first die reference point may be a virtual point on the die surface. The position of the first die reference point is based on the first die fiducials and may be arbitrary selected. For example, the first die reference point may a geometric center of the first die fiducials. Other positions for the first die reference point based on the first die fiducials may also be useful. The position of the first die reference point, for example, may be selected by vendor performing the die bonding and packaging. The x and y coordinates of the first die reference point are inserted into the e-file which is used in downstream processing. For example, the first die reference point coordinates are provided in a die location check (DLC) machine for alignment purposes for downstream processing, such as circuit creation.

In one embodiment, the active die surface may include 4 first die fiducials. The first die reference point may be the geometric center of the 4 first die fiducials. Depending on the positions of the first die fiducials, the first die reference point may or may not correspond to a geometric center of the die. Other numbers of first die fiducials and positions of the first die reference point may also be useful.

In some embodiments, more than one first die reference points may be generated from the first die fiducials. For example, multiple first die reference points are generated based on the first die fiducials. In one embodiment, two first die reference points are generated. For example, primary and secondary first die reference points are generated. The primary first die reference point may be based on the first die fiducials while the secondary first die reference point may be shifted or offset (first reference point offset) from the primary first die reference point. In the case of more than one secondary first die reference points, they may have a different offset from the primary first die reference point or offset from other secondary first die reference points. Other techniques for generating additional or secondary first die reference points may also be useful. The multiple first die reference points can be used to determine x-y and angular shifts in the die position. The coordinates of the first die reference points are inserted into the e-file for downstream processing.

In one embodiment, the edges of the die are identified. For example, the lookup camera identifies the outline of the die. Second die fiducials 517 are defined on the edges of the die. The second die fiducials may be corners of the die edges. For example, the second die fiducials include 4 second die fiducials located at the four corners of the die. Providing other numbers of second die fiducials or edge locations may also be useful. For example, a second die fiducial may be determined based on an offset from a corner. The second die fiducials may be referred to as silicon fiducials.

Based on the second die fiducials, a second die reference point 518 is generated. The second die reference point may be defined by second die reference point coordinates (x, y) (e.g., reference point II (x, y)). The second die reference point may be a virtual point on the die surface. The position of the second die reference point is based on the second die fiducials and may be arbitrarily selected. For example, the second die reference point may be a geometric center of the second die fiducials. Depending on the positions of the second die fiducials, the second die reference point may or may not correspond to a geometric center of the die. Other positions for the second die reference point based on the second die fiducials may also be useful. The second die reference point may be referred to as a silicon reference point. The position of the second die reference point, for example, may be selected by vendor performing the die bonding and packaging. The x and y coordinates of the second die reference point are inserted into the e-file which is used in downstream processing.

In some embodiments, more than one second die reference points may be generated from the second die fiducials. For example, multiple second die reference points are generated based on the second die fiducials. In one embodiment, two second die reference points are generated. For example, primary and secondary second die reference points are generated. The primary second die reference point may be based on the second die fiducials while the secondary second die reference point may be shifted or offset (second reference point offset) from the primary second die reference point. In the case of more than one secondary second die reference points, they may have a different offset from the primary second die reference point or offset from other secondary second die reference points. Other techniques for generating additional second die reference points may also be useful. The multiple second die reference points can be used to determine x-y and angular shifts in the die position. The coordinates of the second die reference points are inserted into the e-file for downstream processing.

Depending on how the first and second die reference points are determined or positions of the first and second die fiducials, the first and second die reference points may be offset from one another. For example, as shown, the first and second die reference points are offset by an offset 540. The offset of the second die reference point with respect to the first die reference point may be referred to as a reference point offset. Alternatively, the first and second die reference points may be aligned with one another, such as one on top of the other. For example, the reference point offset value is zero. The first die reference point or points are employed for pre-bonding inspection while the second die reference points are used for post bond inspection. This is because the first die reference points are no longer visible after bonding.

The pre-alignment inspection by the lookup camera is completed. For example, the die reference points are determined. The die reference points may correspond to the die position. In addition, the reference point offset may be stored in the system memory of the die bonder.

As for the pre-alignment inspection by the lookdown camera, it includes identifying the positions of the local carrier alignment marks or carrier fiducials 527 in the die bond region 525 of the carrier. The local carrier fiducials are used to determine a target bond position. For example, the target bond position is based on the local carrier fiducials. In one embodiment, the target bond position is a carrier reference point based on the carrier fiducials. In one embodiment, the die bond region of the carrier includes 4 local carrier fiducials. A carrier reference point is generated based on the local carrier fiducials. For example, the carrier reference point may be the geometric center of the local carrier fiducials and corresponds to the geometric center of the die bond region. Providing other numbers of local carrier fiducials or positions for the carrier reference point may also be useful.

In a preferred embodiment, the target bond position includes multiple carrier reference points. In one embodiment, 2 carrier reference points are generated based on the local carrier fiducials. For example, the die bond region includes a primary and a secondary carrier reference point. Other numbers of carrier reference points may be generated. The number of carrier reference points may correspond to the number of first die reference points. In other cases, the number of carrier reference points may be different from the number of first die reference points. The primary carrier reference point may be based on the local carrier fiducials while the secondary carrier reference point may be shifted or offset (carrier reference point offset) from the primary carrier reference point. In the case of more than one secondary carrier reference points, they may have a different offset from the primary carrier reference point or offset from other secondary carrier reference points. Other techniques for generating additional or secondary carrier reference points may also be useful.

The pre-alignment inspection by the lookdown camera is completed. For example, the local carrier fiducial positions are determined. The positions of the local carrier fiducials may be stored in the system memory.

After pre-alignment inspection, the die is aligned to the target bond position on the carrier. For example, the die is aligned to the target bond position in the x and y directions as well as angularly. Alignment of the die may include an offset (alignment offset) of the first die reference point and carrier reference point. Depending on the positions of the first die reference point and carrier reference point, the alignment offset may have a non-zero value. For example, in the case of a non-zero value alignment offset, the first die reference point is shifted from the carrier reference point. In the case of a zero value alignment offset, the first die reference point is directly aligned with the carrier reference point. Other techniques for aligning the die to the target bond position may also be useful. The alignment offset may be stored in the system memory. In other cases, the number of carrier reference points need not correspond to the number of first die reference points. Preferably, both the carrier and the die should at least 2 reference points. With 2 reference points, a virtual line can be formed therebetween. Interposing the lines between the 2 reference points from the die and the carrier enables the determination of angular offset as well as the offset in the x and y axes (x-y offset). Once aligned, the bonding head attaches the die to the target bond region.

Figure 5B:
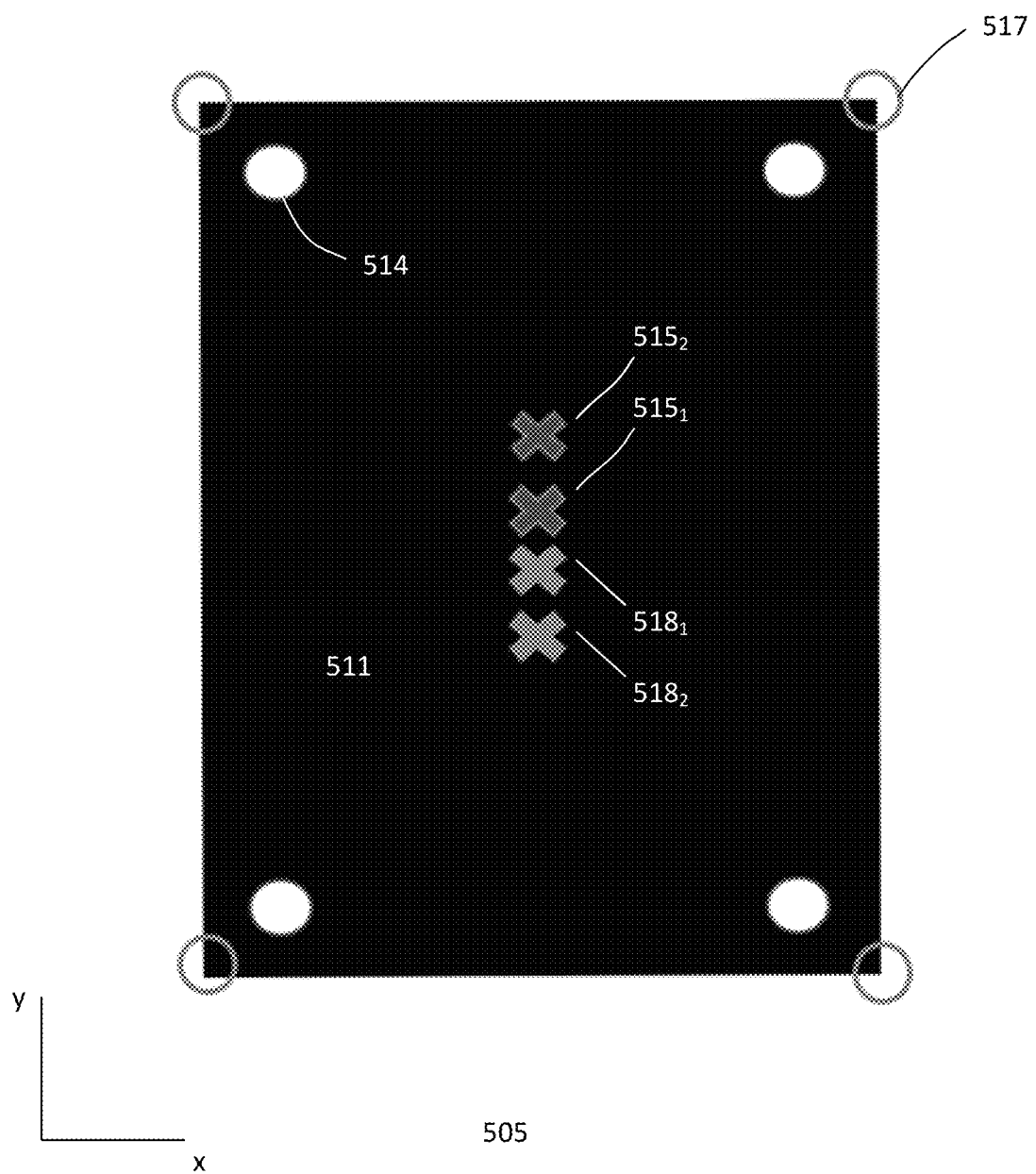
FIG. 5b shows an exemplary embodiment of a die with multiple first and second die reference points.

FIG. 5b shows an exemplary embodiment of a die with multiple first and second die reference points. As shown, the active die surface 511 includes first die fiducials 514. In one embodiment, first die reference points $515_{1-2}$ are generated from the first die fiducials 514. One of the first die reference points $515_1$ (primary first die reference point), for example, may be the center of the first die fiducials while another first die reference point $515_2$ (secondary first die reference point) may be offset from the primary first die reference point. For example, the secondary first die reference point may be offset in the y direction (upwards). The offset of the first die reference points may be referred to as the first reference point offset. Other configurations of or techniques for generating the first die reference points may also be useful.

As for the edge of the die, it includes second die fiducials 517. The second die fiducials, for example, may be located at the corners of the die edge. The second die fiducials are used to generate second die reference points $518_{1-2}$. One of the second die reference points $518_1$ (primary second die reference point), for example, may be the center of the second fiducials while the second die reference point $518_2$ (secondary second die reference point) may be offset from the primary second die reference point. For example, the secondary second die reference point may be offset in the y direction (downwards). The offset of the second die reference points may be referred as the second reference point offset. Other configurations of or techniques for generating the second die reference points may also be useful.

The die reference points may be defined by die reference point coordinates (x, y) (e.g., die reference point I (1) (x, y), die reference point I (2) (x, y), die reference point II (1) (x, y), and die reference point II (2) (x, y)). As described, the exemplary embodiment includes two first and two second die reference points. It is understood that calculating other numbers of first and second die reference points from first and second die fiducials may also be useful.

As shown, the primary first die reference point $515_1$ is offset from the primary second die reference point $518_1$. For example, the primary first die reference point and the primary second die reference point include a reference point offset. Once the primary second die reference point is determined by post bond inspection by, for example, identifying the second die fiducials, the secondary second die reference point can be determined by the second reference point offset from the primary second die reference point and the primary first die reference point can be determined based on the reference point offset from the primary second die reference point. The secondary first die reference point may be determined based on the first reference point offset from the primary first die reference point. Other techniques for determining the first and second die reference points may also be useful.

Figure 5C:
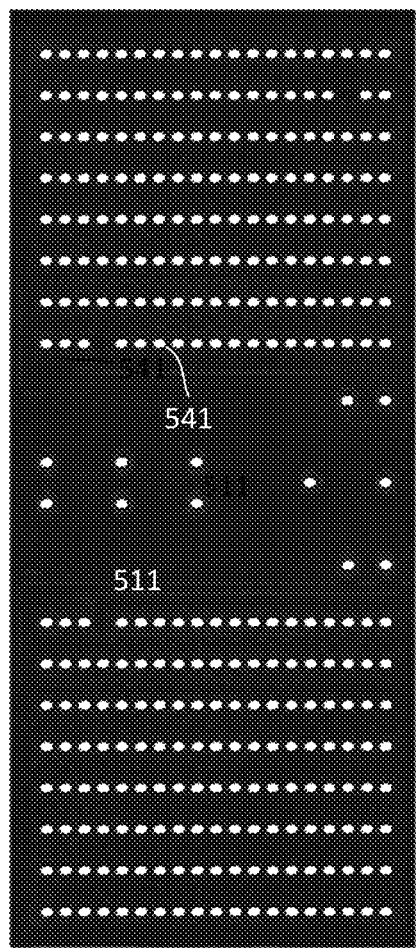
FIGS. 5c-d show alternative embodiments of patterns on an active surface of a die which can be employed as first die fiducials
Figure 5D:
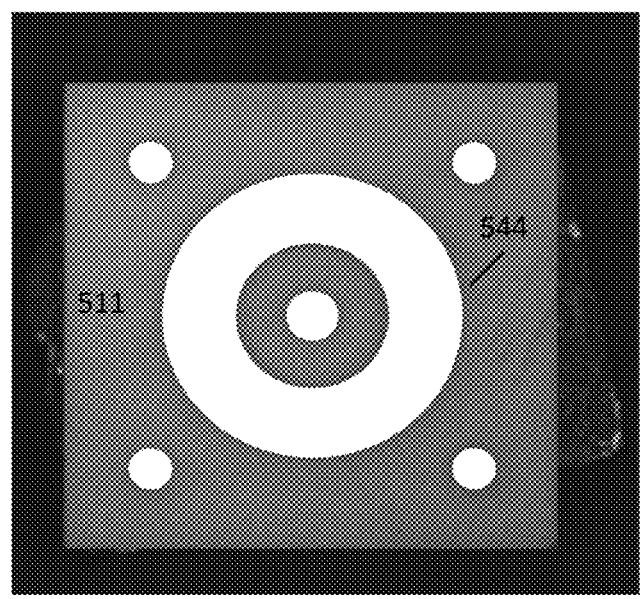

FIGS. 5c-d show alternative embodiments of patterns on an active surface of a die which can be employed as first die fiducials. Referring to FIG. 5c, the active surface 511 of a die 505 includes via features 541. As can be seen, the via features can have various patterns or distributions on the active surface. Some of the via features can be selected to serve as first die fiducials from which first die reference points may be derived. In other embodiments, as shown, in FIG. 5d, the active surface 511 of the die 505 may include a circuit pattern 544. Some features of the circuit pattern may be selected to serve as first die fiducials for generating first die reference points.

Figure 5E:
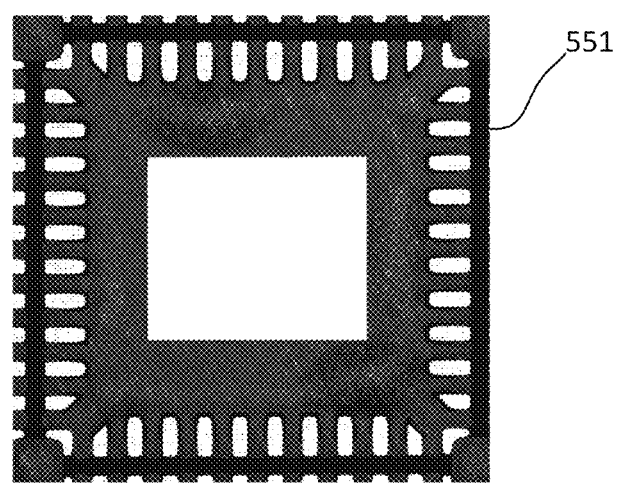
FIG. 5e shows an alternative embodiment of a die bonding region on the carrier.

FIG. 5e shows an alternative embodiment of a die bonding region on the carrier. As shown, the die bonding region 525 is mounted with a lead frame 511. For example, the lead frame may be mounted onto the die bonding region based on local carrier fiducials. The local carrier fiducials serve as alignment marks for bonding the die to the die bonding region of the lead frame. The lead frame may include features or patterns which serve as local carrier fiducials for mounting a die to the die bonding region.

Figure 5F:
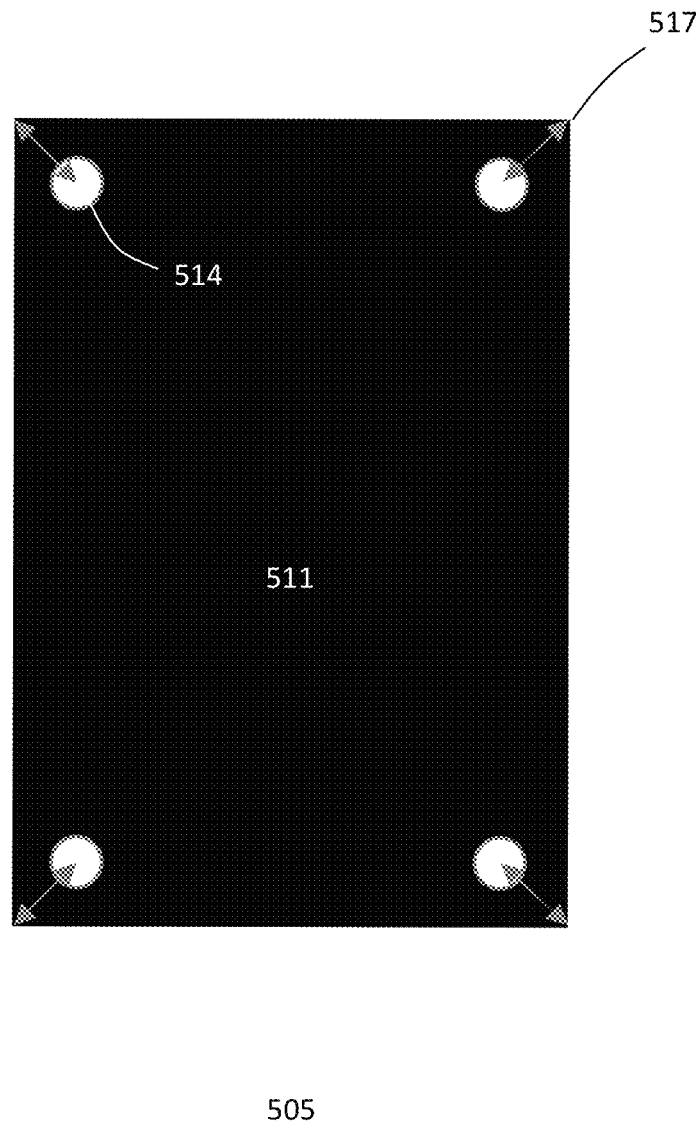
FIGS. 5f-g show alternative embodiments of determining an offset.
Figure 5G:
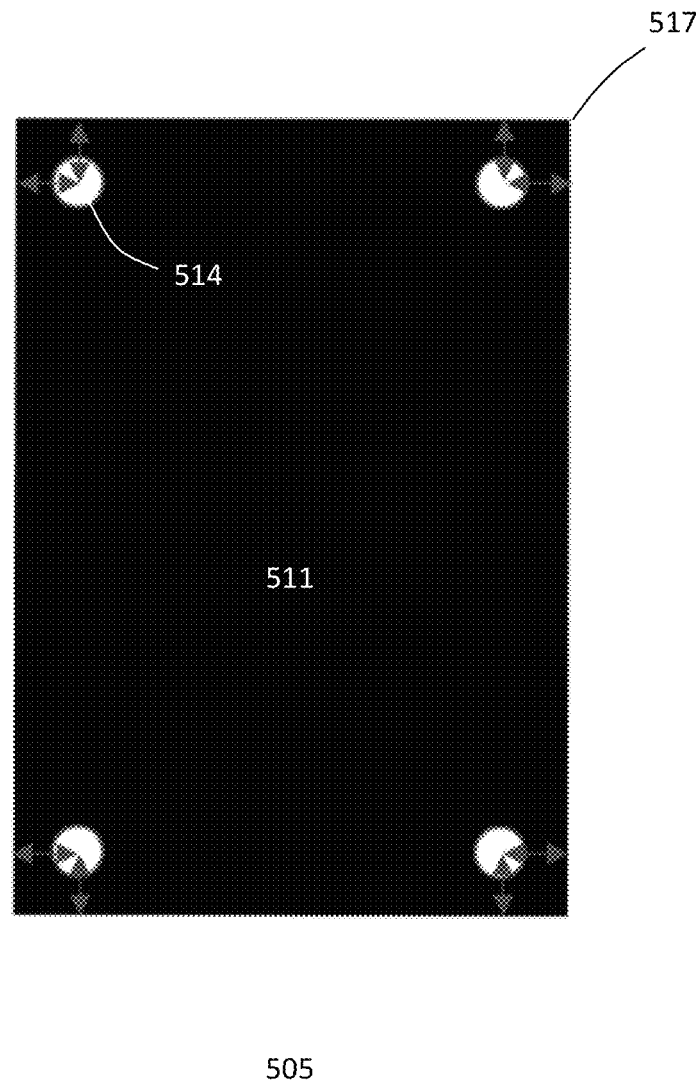

FIGS. 5f-g show alternative embodiments of determining an offset. For example, as shown in FIGS. 5f-g, the offset can be generated directly from the first 514 and second 517 die fiducials. For example, no reference points are generated. The offset between the first and second die fiducials (die fiducial offset or offsets) are known. Each first die fiducial may have a die fiducial offset to its respective second die fiducial. The offset may be the same or different depending on the positions of the first and second die fiducials. During post bond inspection, the second die fiducials are identified. Once the second die fiducials are identified, the position of the first die fiducials can be determined based on the die fiducial offset.

In other embodiments (not shown), the offset (fiducial-reference point offset) can be generated based on the second die fiducials and the first die reference point. The first die reference point may have an offset with respect to each of the die fiducials. The offset may be the same or different, depending on the positions of the first die reference point and second die fiducials. During post bond inspection, the second die fiducials are identified. The first die reference point can be determined based on the fiducial-reference point offset from the second die fiducials. Different offsets may be used for different second die fiducials. Multiple second die fiducials, such as 2 second die fiducials, are preferred. Multiple second die fiducials enable determination of the angular offset as well the x-y offset.

In another embodiment (not shown), the offset can be generated from the second die reference point and the first die fiducials. Each first die fiducial may have its respective offset (reference point-fiducial offset) from the second die reference point. For example, the second die reference point can be determined based on the second die fiducials during post bond inspection. The first die fiducials can be determined based on the reference point-fiducial offset. The number of first and second die fiducials may be the same. For example, the die may have 4 first die fiducials and 4 second die fiducials. Each first die fiducial may be associated or have a corresponding second die fiducial. The first die fiducial forms a first rectangle and the second fiducials form a second rectangle. The angle offset and center offset between the 2 rectangles can be computed.

Figure 5H:
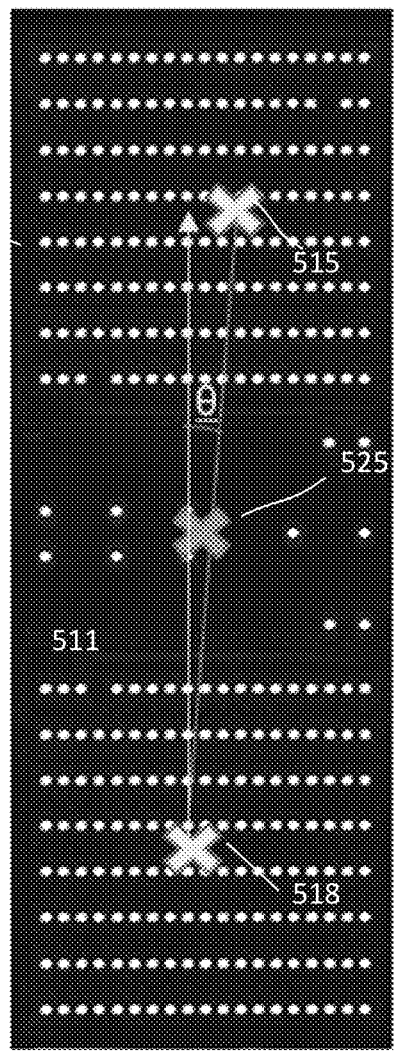
FIG. 5h illustrates an embodiment of generating a reference point from 2 die reference points.

FIG. 5h illustrates that a reference point can be generated from 2 die reference points. For example, die reference points 515 and 518 are known or determined based on, for example, second die fiducials. The die reference points may have coordinates die reference point (1) (x, y) and (2) (x, y). The die reference points, for example, may be second die reference points. A reference point (generated reference point) 525 can be determined from the second die reference points. For example, the generated reference point is disposed between the second die reference points. The generated reference point may have reference point * (a, b) and θ. The generated reference point, for example, may serve as the first die reference point. During post bond inspection, the second die reference points may be identified by, for example, second die fiducials. Based on the second die reference points, the generated reference point can be determined based on (a, b) and θ.

FIG. 6a is a simplified illustration of a post bond inspection 600 performed by the die bonder. The alignment carrier 520 bonded with a die 505 is inspected for post bond alignment. In one embodiment, the die is configured for bonding face-down onto the alignment carrier. For example, a bottom surface of the die which is bonded to the surface of the alignment carrier is the active surface. After bonding, the camera module 550 extends into position for post bond inspection of the die bond region with the die.

The camera module is configured to inspect the die bond region using the lookdown camera. For example, a prism 555 directs light onto the bonding region on the carrier, capturing an image of the die bond region 525 with the die 505. An image of the top surface 512 and the die 505 on the die bond region 525 is captured. In one embodiment, the die is configured to be disposed within local carrier fiducials 527, enabling them to be visible after die bonding.

Based on the image, the second die reference point is generated according to the second die fiducials. For example, the second die fiducials on the edge of the die are identified and the second die reference points are calculated. In one embodiment, the first die reference point is then generated based on the offset. For example, the first die reference point is generated based on the reference point offset. Other techniques for determining the first die reference point may also be useful. For example, the offset may be based on the fiducial offset, fiducial-reference point offset or reference point-fiducial offset.

In addition, the local carrier fiducials on the alignment carrier are identified. The local carrier fiducials, for example, serve as a reference for the target bond position. In one embodiment, the first die reference point is compared with the target bond position, such as the local carrier fiducials or carrier reference point, for post bond inspection. The alignment offset may be retrieved from the system memory. If post bond inspection determines that the distance of the first die reference point from the target bond position (including the alignment offset) is less than or equal to a post-bond inspection offset threshold, then the inspected die passes post bond inspection and post bond inspection for the inspected die terminates. On the other hand, if post bond inspection fails, for example, in the case where the distance of the first die reference point from the target bond position is greater than the post bond inspection offset threshold, the image of the inspected die is stored for failure analysis.

In some cases, multiple first die reference points are calculated. Additional first die reference point or points may be based on, for example, a first reference point offset. Multiple first die reference points enable detection of angular misalignment of the bonded die to the target bond position.

Figure 6B:
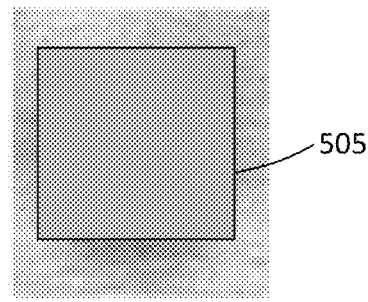

In other embodiments, as shown in FIG. 6b, the die 505 covers the local carrier fiducials after bonding. As a result, the local carrier fiducials are not visible to the lookdown camera. Other configurations of the die and die bond region may also be useful. In the case where the die covers the local carrier fiducials after bonding, the locations or positions of the local carrier fiducials on the carrier are memorized and stored in the system memory of the die bonder. During post bond inspection, the lookdown camera recalls the positions of the local carrier fiducials and reads the second die fiducials on the edge of the die. The target bond position on the carrier is generated based on the recalled positions of the local carrier fiducials.

As described, the post bond inspection of a die can be performed after die bonding without removing the carrier. For example, the alignment carrier remains intact on the die bonder after die bonding for die bond inspection. This results in real-time post bond inspection right after die bonding using the die bonder. Furthermore, each die may be post bond inspected or intermittent dies may be post bond inspected. For example, at the beginning, to qualify a process, each die may be post bond inspected. However, as the process is established, dies may intermittently be post bond inspected. For example, every $10^{th}$ die may be post bond inspected. Other intermittencies or periodicity for inspecting the bonded dies may also be useful.

Figure 7:
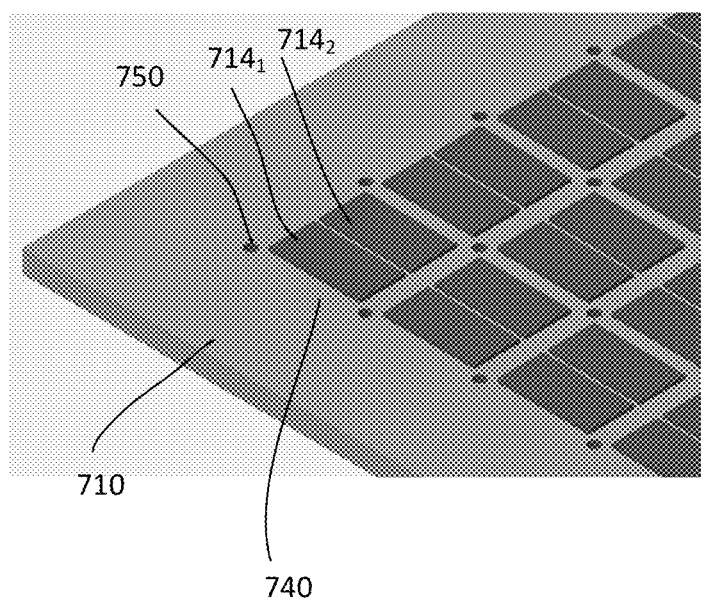
FIG. 7 shows an exemplary portion of an alignment carrier for bonding multiple dies to a bonding region.

FIG. 7 shows a simplified diagram of a portion of an embodiment of an alignment carrier 710. The alignment carrier includes a plurality of die bond regions 740 arranged in a matrix format. The die bond regions may be separated into blocks of die bond regions. Surrounding a die bond region are local carrier alignment marks or carrier fiducials 750. For example, four local carrier fiducials are provided for each die bond region, surrounding corners of the die attach region. Providing other numbers of local carrier fiducials as well as other configurations of local carrier fiducials may also be useful.

In one embodiment, a die attach region is configured to attach multiple dies. For example, as shown, a die attach region includes first and second die attach regions configured for attaching first and second dies $714_1$ and $714_2$. Attaching other numbers of dies to a die attach region may also be useful. The multiple dies on the die attach regions are attached using the same local carrier fiducials. Using the same local carrier fiducials ensures relative accurate positioning of the dies on the die attach regions. Furthermore, using the same local carrier fiducials enables accurate die positioning for interconnections between dies, such as high annular ring tolerance. In addition, using the same alignment marks eliminates errors due to hole positions. For example, if separate alignment marks are used for positioning the multiple dies, then the error due to the hole position may be added to the positional error between the dies.

As described, the local carrier fiducials are disposed outside of the die attach regions of the die bond region. This is advantageous since, as already discussed, this enables the same local carrier fiducials to be used for attaching the dies. However, in some cases, the alignment marks may be disposed within the die attach regions. In such cases, each die attach region of the die bond region may need respective sets of local carrier fiducials. In other cases, there may be a combination of alignment marks within and outside of a die attach region of a die bond region. It is understood that various configurations of local carrier fiducials for the die attach regions of the die bond region may be employed.

Figure 8A:
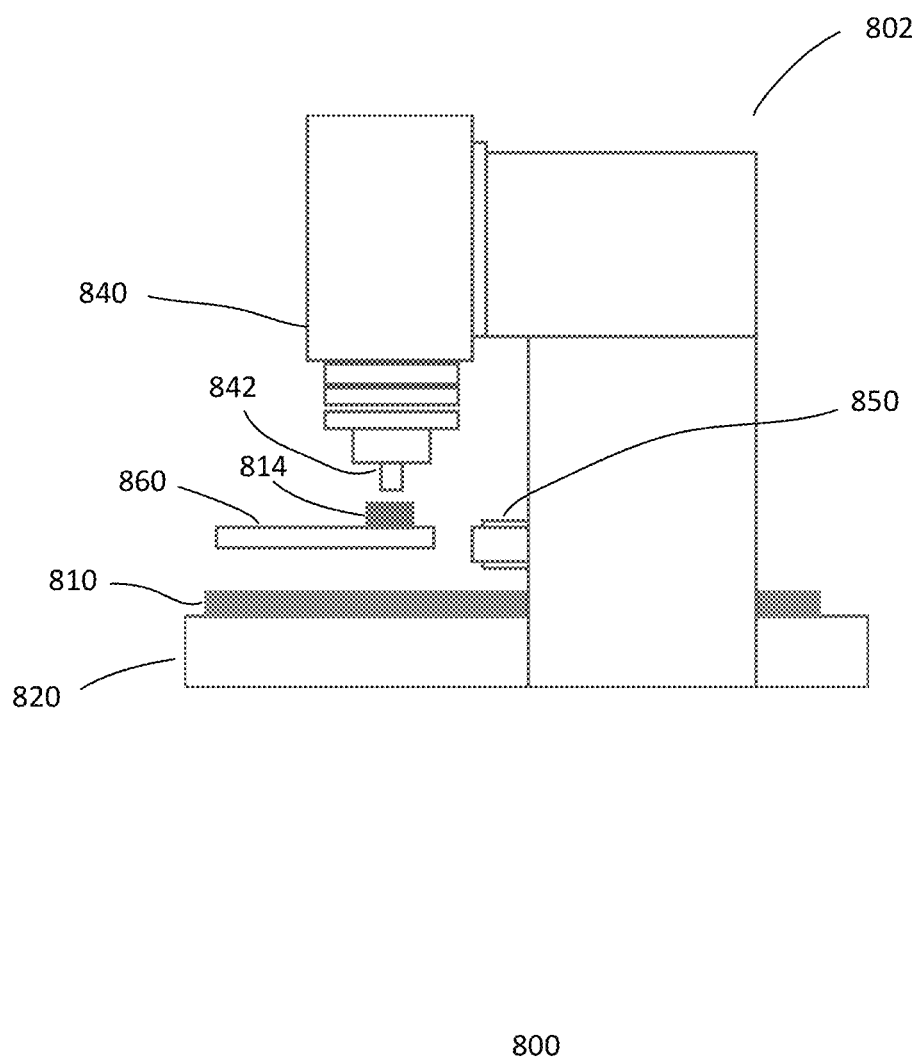
FIGS. 8a-8g show simplified diagrams depicting an embodiment of a process for die bonding on an alignment carrier and post bond inspection.

FIGS. 8a-8g show simplified diagrams depicting an embodiment of a process 800 for die bonding on an alignment carrier and post bond inspection. Referring to FIG. 8a, a die bonder 802, such as that described in, for example, FIGS. 4a-4c is shown. An alignment carrier or panel 810 is disposed on the base assembly 820. A support alignment assembly may align the bonding head to the die bond region on the carrier. For example, coarse alignment of the bonding head 842 to the carrier is performed. A die feeder assembly 860 feeds a die 814 to the bonding head. For example, the die feeder extends under the bonding head.

Figure 8B:
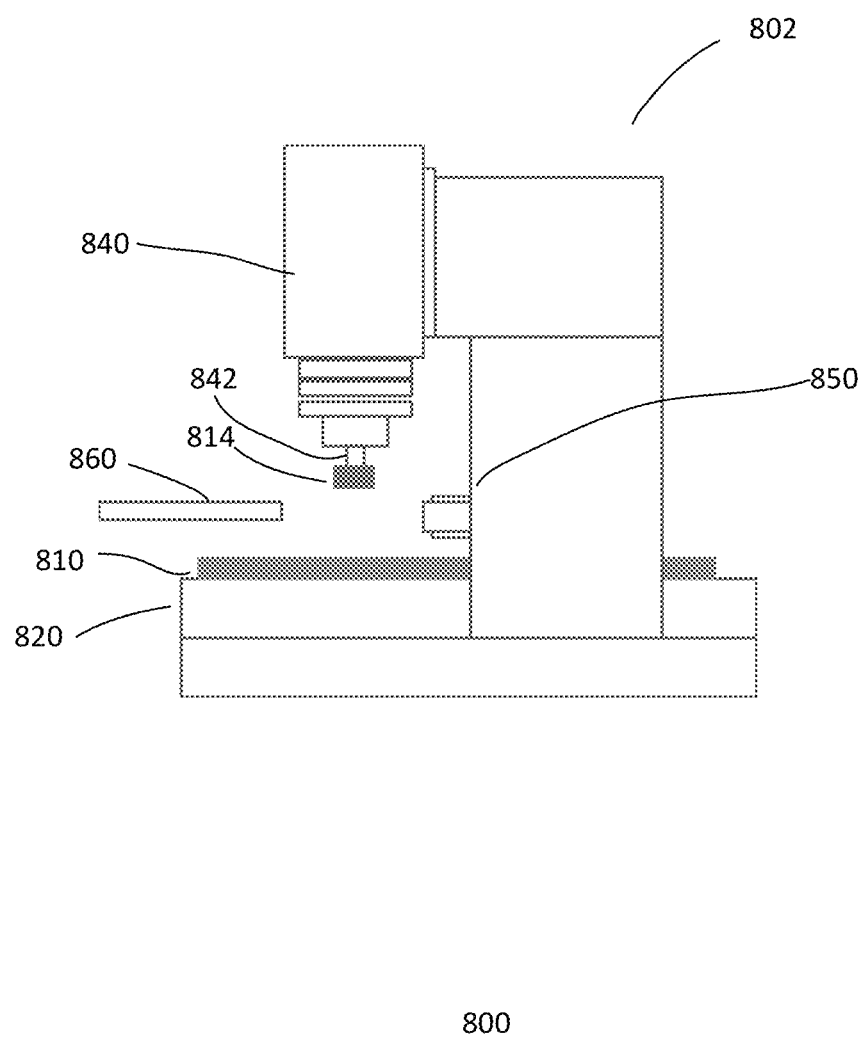

Referring to FIG. 8b, the bonder of the bonding head 842 picks up the die 814 from the feeder 860. For example, the bonding assembly actuator 840 positions the bonding head 842 on top of the die and the bonding head actuator actuates the bonder of the bonding head to pick up the die. The bonder may employ vacuum pressure to pick up the die from the die feeder. After the die is picked up, the die feeder is retracted away, exposing the die attach region on the carrier on which the die is to be attached. It is understood that the coarse alignment of the alignment carrier can be performed after die pickup.

Figure 8C:
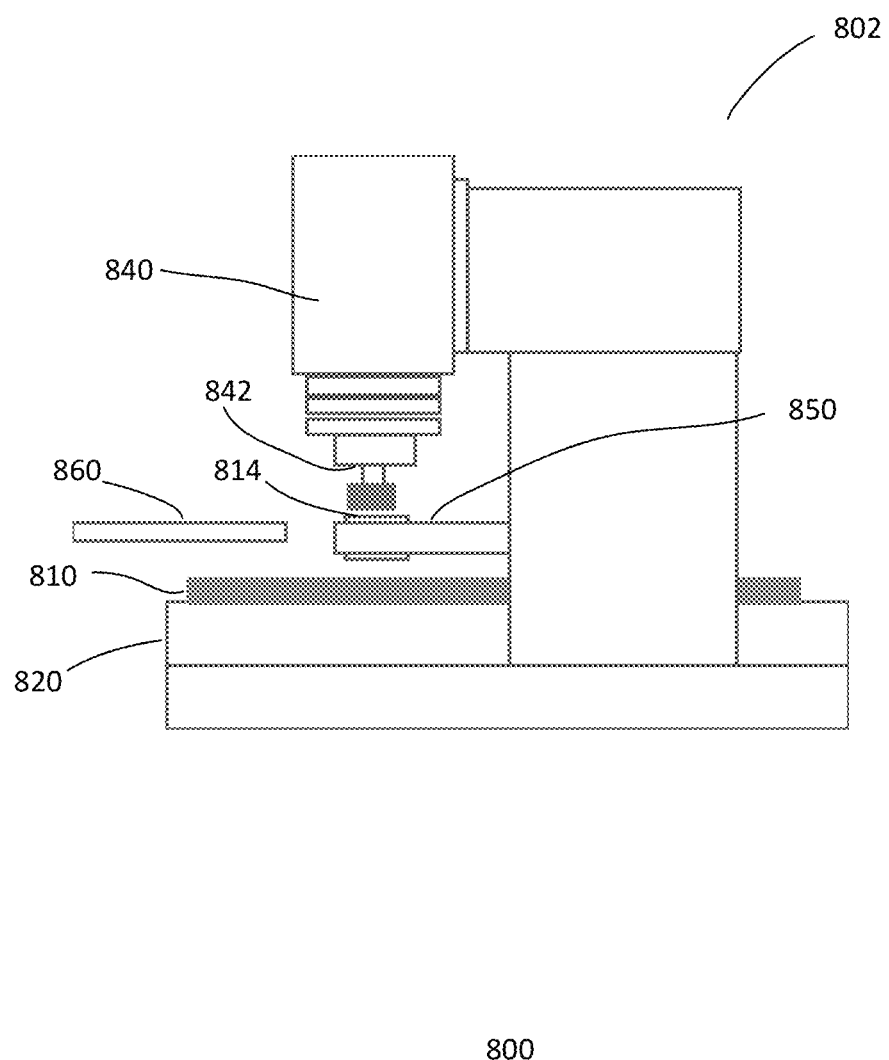

In FIG. 8c, the camera module 850 is extended into position for pre-alignment inspection. For example, the lookup camera and lookdown camera of the camera module inspect the bottom of the die, the edges of the die and the bonding region of the alignment carrier.

The pre-alignment inspection determines the offset. For example, the pre-alignment inspection determines the reference point offset. The lookup camera identifies the first and second die fiducials on the die. For example, the first die fiducials are identified on the active surface of the die and the second die fiducials are identified on the edge of the die. From the first die fiducials, the first die reference point is calculated; from the second die fiducials, the second die reference point is calculated. The offset between the first and second die reference points is the reference point offset. In the case of more than one first and second die reference points, the additional first and second die reference points may be offset (first and second reference point offsets) from the original first and second die reference points based on the first and second die fiducials. The first and second reference point offsets may have the same offset values. Providing first and second reference point offsets with different offset values may also be useful. In other embodiments, the offset may be another type of offset. For example, the offset may be a fiducial offset, a fiducial-reference point offset, or a reference point—fiducial offset. The offset is stored in the system memory.

The alignment offset is also determined. The alignment offset, for example, may be the package center to die center offset. For example, the alignment offset is an offset of the first die reference point to a carrier reference point based on the carrier fiducials. The alignment offset may be stored in the system memory.

The pre-alignment inspection also determines the target bond position on the alignment carrier. For example, the lookdown camera reads the local carrier fiducials on the carrier and positions the camera module over the target bond position. The target bond position, in one embodiment, is based on the local carrier fiducials on the alignment carrier. In other embodiments, the target bond position may be on a lead frame having a lead frame pattern with features which may serve as local carrier fiducials.

The target bond position may include one or more carrier reference points. Preferably, more than one carrier reference points are generated based on the local carrier fiducials. In one embodiment, two carrier reference points are generated. Other numbers of carrier reference points may be generated. The number of carrier reference points may correspond to the number of first die reference points. In other cases, the number of carrier reference points and the number of first die reference points are different.

In one embodiment, the positions of the local carrier fiducials are saved in the system memory. For example, the position of the camera module over the target bond position is saved. This is particularly useful for applications in which the die covers the local carrier fiducials after bonding.

After pre-alignment, the die is then aligned to the target bond position or die attach region within the die bond region. The die attach region may be a region on the die bond region of the carrier. Alignment includes positioning the bonding head and camera module so that the die is aligned to the target bond position on the die attach region, both in the x and y directions and also rotationally. For example, the camera module has a direct line of sight with the die and the die attach region.

Figure 8D:
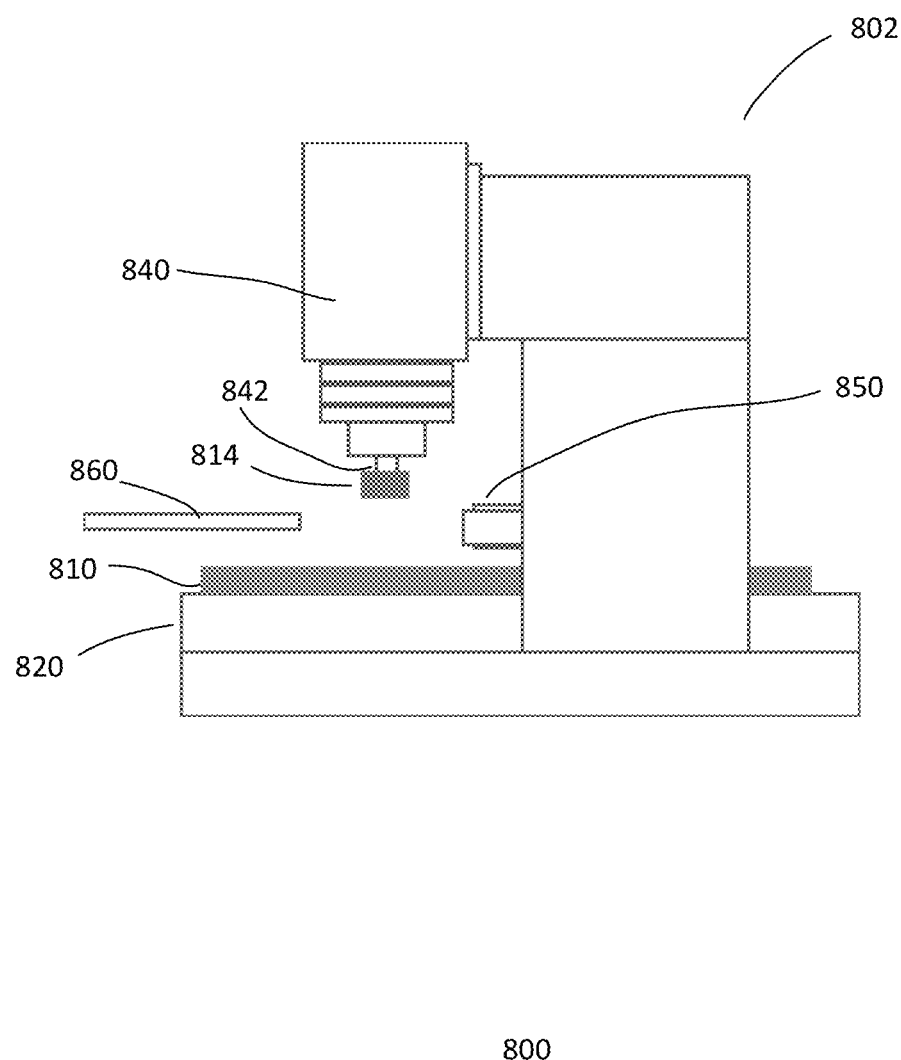
Figure 8E:
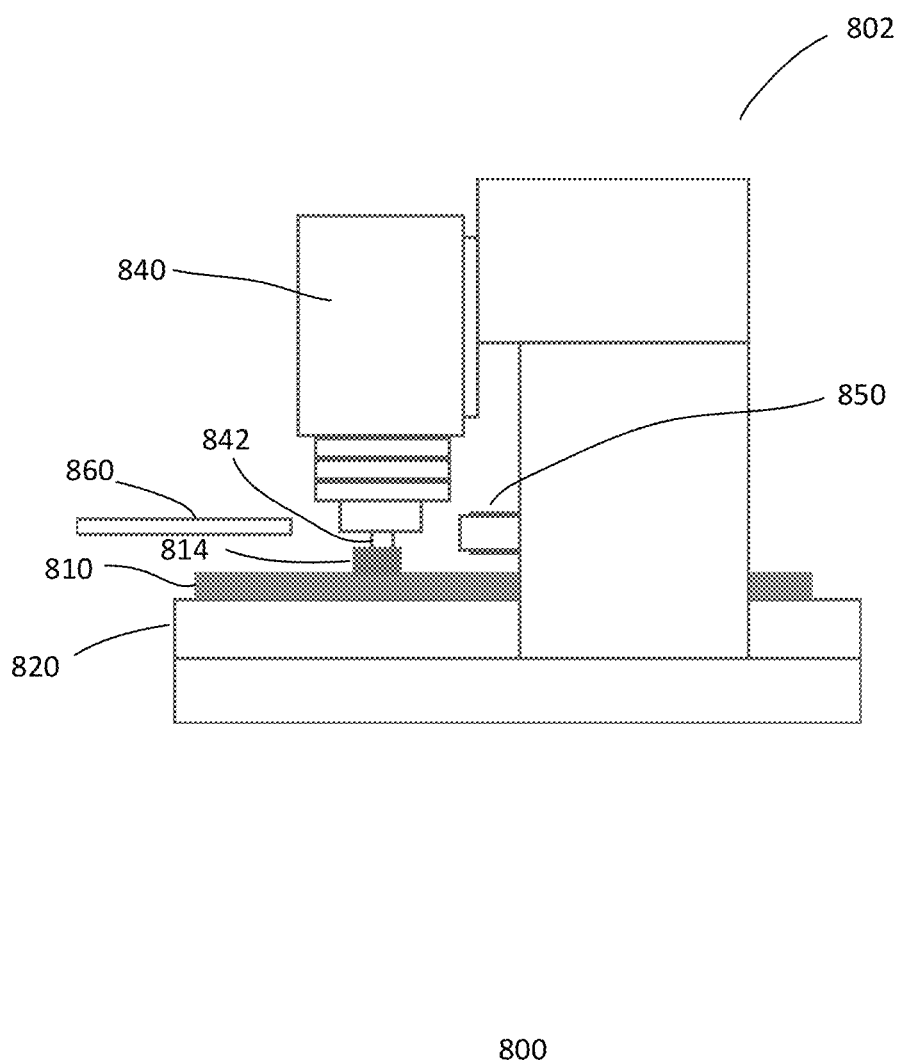

Once the die is aligned to the target bond position, camera module 850 is retracted, as shown in FIG. 8d. Retracting the camera module exposes the die attach region on the carrier 810. In FIG. 8e, the bonding assembly is actuated to move the bonding head vertically to attach the die to the die attach region on the alignment carrier.

Figure 8F:
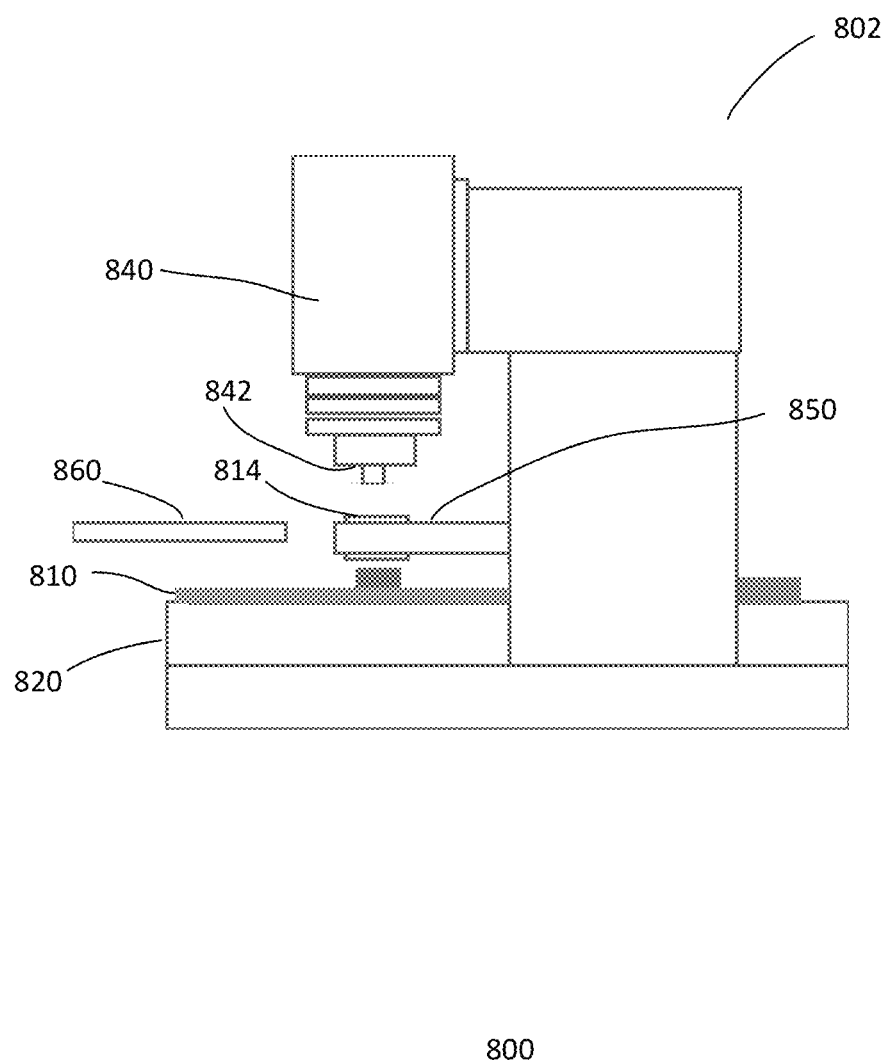

In FIG. 8f, the camera module is extended into position for post bond inspection after the die is attached. For example, if a die is designated for post bond inspection, the camera module is extended into position. The camera module may extend into position based on the local carrier fiducials that are visible on the carrier. In another embodiment, the camera may extend into position based on the target bond position stored as information in the system memory. For example, the system recalls the positions of the local carrier fiducials which are stored in memory and positions the camera module accordingly. This is particularly useful for applications where the local carrier fiducials are not visible as a result of the die covering them.

Post bond inspection commences. Post bond inspection, for example, is performed as described in FIGS. 6a-b. The post bond inspection determines if the die bonded to the die bond region is aligned, for example, within a post bond inspection offset. Other techniques for post bond inspection for determining if the bonded die is correctly aligned within the specified threshold offset may also be useful.

Figure 8G:
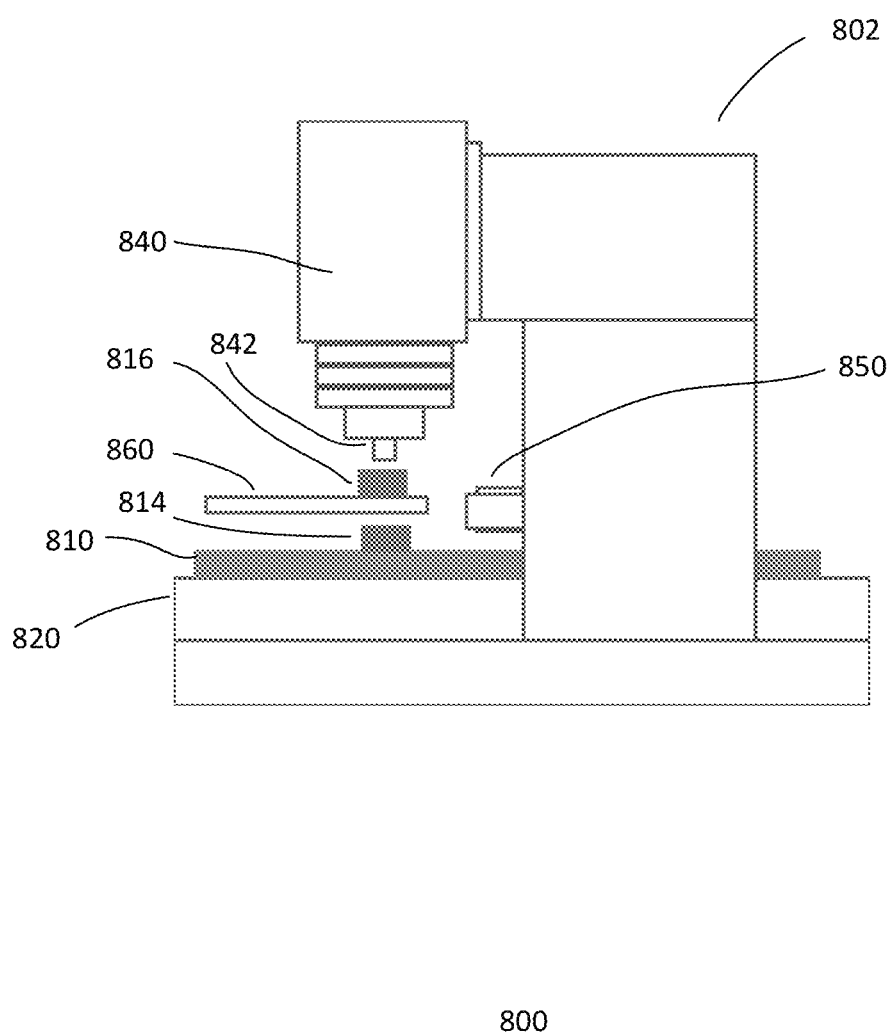

In one embodiment, if post bond inspection fails, the failed die is identified. The image of the failed inspection is saved in the system memory. Failure analysis may be performed subsequently. The process then continues to bond the next die, as shown in FIG. 8g. On the other hand, if the bonded die passes post bond inspection, the process continues to attach a next die, as shown in FIG. 8g, without the need to save the image of the passed inspection. Alternatively, the image of the passed inspection may also be saved. To bond the next die, the bonding head is translated to the next die attach region stage on the carrier 820 and the die feeder 860 provides another die 816 to the die bonder for die bonding.

The process repeats by aligning and attaching the die to the die attach region until all die attach regions on the carrier are bonded with dies. After bonding of each die, post bond inspection may be performed if a bonded die is designated for post bond inspection. Furthermore, the controller of the system is programmed to know whether an alignment die or a live die is to be supplied to the bonding tool by basing on which die region on the carrier for bonding.

As previously discussed, the die bonder may be configured with a translatable base assembly to perform coarse alignment while the support alignment assembly performs fine alignment. In addition, alignment dies may be the same as a live die or specifically for alignment purposes.

Figure 9:
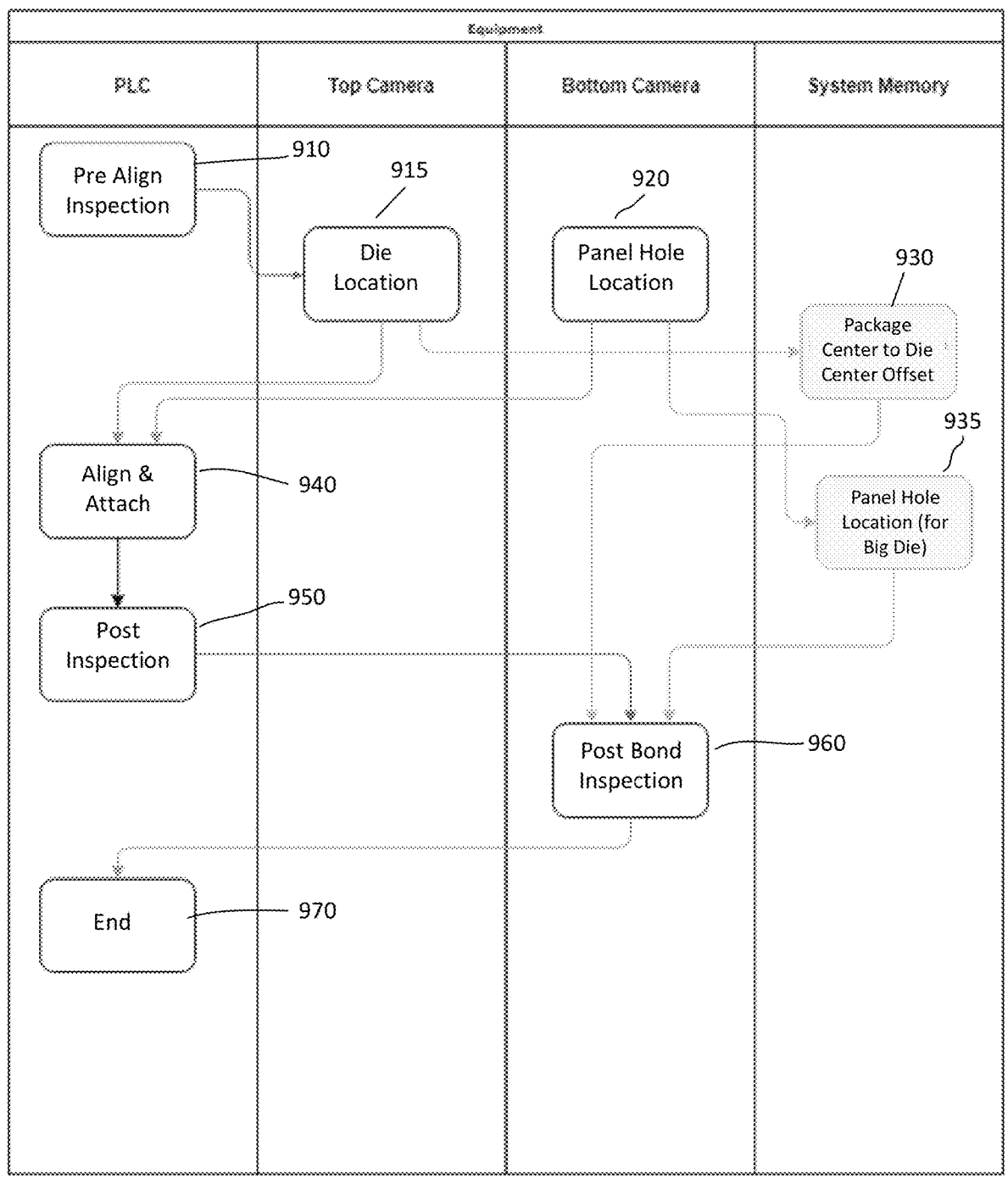
FIG. 9 shows an embodiment of a process flow for die bonding and post bond inspection by various components of the die bonding tool.

FIG. 9 shows an embodiment of a process flow 900 of die bonding and post bond inspection by various components of the die bonder. The process flow includes components of the die bonder involved. As shown, at 910, the system controller instructs the die bonder for pre-alignment inspection after a die is picked up by the bonding head. The controller, for example, may be a programmable logic controller (PLC). Pre-alignment inspection includes, at 915 calculating the post bond inspection offset. For example, after the die is picked up by the bonding head, pre-alignment inspection is performed. This includes extending the camera module into position for pre-alignment inspection.

In one embodiment, the pre-alignment inspection determines the offset. For example, the pre-alignment inspection determines the reference point offset. This may include identifying the first and second die fiducials on the die by the lookup camera. The first die reference point is calculated from the first die fiducials and the second die reference point is calculated from the second die fiducials. The offset between the first and second die reference points is the reference point offset. In the case of more than one first and second die reference points, the additional first and second die reference points may be offset (first and second reference point offsets) from the original first and second die reference points based on the first and second die fiducials. The first and second reference point offsets may have the same offset values. In other embodiments, the offset may be another type of offset. For example, the offset may be a fiducial offset, a fiducial-reference point offset, or a reference point—fiducial offset. The offset is stored in the system memory at 930. In addition, an alignment offset may also be stored in memory. The alignment offset, for example, is the offset between the target bond region and the first die reference point. This may correspond to the package center to die center offset.

In one embodiment, the target bond position on the alignment carrier is determined at 920. For example, the lookdown camera reads the local carrier fiducials on the carrier and positions the camera module over the target bond position. The target bond position, in one embodiment, is based on the local carrier fiducials on the alignment carrier. In other embodiments, the target bond position may be on a lead frame that has a lead frame pattern with features which serve as local carrier fiducials.

The target bond position may include one or more carrier reference points. Preferably, more than one carrier reference points are generated based on the local carrier fiducials. In one embodiment, two carrier reference points are generated. Other numbers of carrier reference points may be generated. The number of carrier reference points may correspond to the number of first die reference points. In other cases, the number of carrier reference points and the number of first die reference points are different In one embodiment, the positions of the local carrier fiducials are saved in the system memory at 935. For example, the position of the camera module over the target bond position is saved. This is particularly useful for applications in which the die covers the local carrier fiducials after bonding.

After pre-alignment inspection is completed, the controller aligns the die to the target bond position at 940, for example, based on the first die reference points and target bond position. Alignment includes positioning the bonding head so that the die is aligned to the target bond position on the die bond region of the carrier. For example, the die is aligned to the target bond position in the x and y directions and also rotationally. When aligned, the camera module has a direct line of sight with the die and the die attach region. Once the die is aligned to the target bond position, the die is bonded to the alignment carrier. For example, the camera module is retracted and the bonding head is actuated to bond the die to the target bond position on the alignment carrier.

After the die is bonded, the controller initiates post bond inspection at 950. For example, the camera module is extended into the inspection position at 960. The camera module may extend into position based on the local carrier fiducials that are visible on the carrier. In another embodiment, the camera may extend into position based on the target bond position stored as information in the system memory. For example, the system recalls the position of the local carrier fiducials which are stored in memory and positions the camera module accordingly. This is particularly useful for applications where the local carrier fiducials are not visible as a result of the die covering them.

Post bond inspection includes inspecting the die bond region with the bonded die to determine if the die is aligned. For example, the offset such as the reference point offset is retrieved from the system memory and, if necessary, also the positions of the local carrier fiducials. The alignment of the bonded die may be determined based on the offset of the die to the target bond position. For example, post bond inspection determines whether the distance (post bond inspection offset) of the first die reference point from the target bond position is less than or equal to a post bond inspection offset threshold. If the post bond inspection offset exceeds the threshold, then post bond inspection has failed. If the post bond inspection offset is equal to or less than the threshold, then post bond inspection has passed. After post bond inspection of the bonded dies has completed, the post bond inspection terminates at 970.

Figure 10:
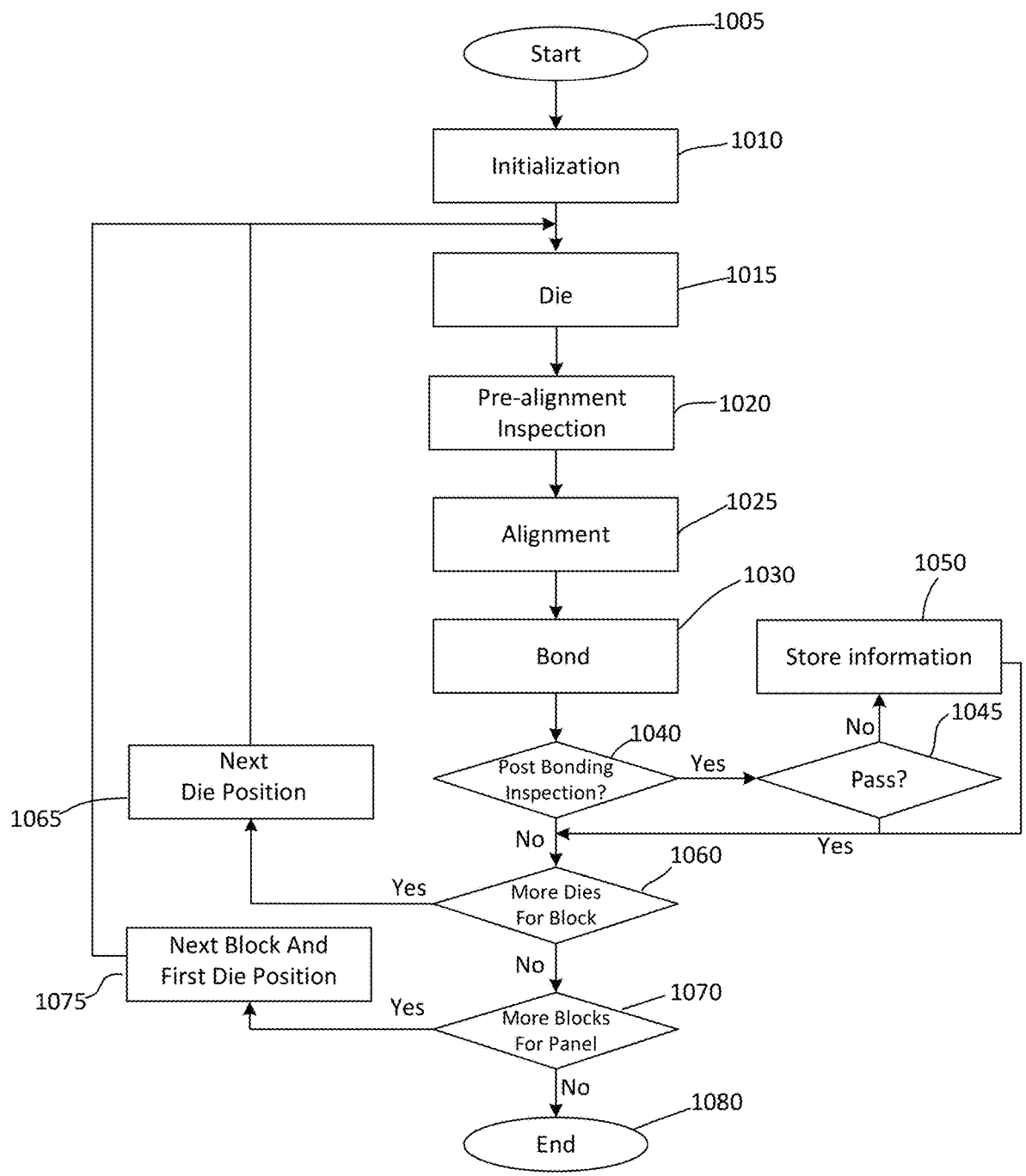
FIG. 10 shows an embodiment of a simplified flow for bonding dies to an alignment carrier and performing post bond inspection.

FIG. 10 shows an exemplary embodiment of an overall process flow 1000 for die bonding and post bond inspection on a carrier.

The process commences at 1005. Initialization may be performed at 1010. Initialization may include information regarding the bonding process. For example, the size of the carrier, number of the blocks, size of the blocks, the number of dies in a row and number of dies in a column. In addition, initialization information may include the starting point of the bonding process, such as the starting block and starting die position within the block, and which die positions are live die positions and alignment die positions. Other information may include carrier alignment points in a carrier CAD file and die alignment points in a die CAD file to facilitate alignment.

At 1015, a die is provided to the die bonder. For example, an appropriate die (live or alignment die) is provided to the bonding head by a die feeder. The bonding head picks up the die from the die feeder. After die pickup, the die feeder is retracted to expose the die bond region on which the die is to be bonded. For example, coarse alignment of the die bond region is performed prior to die pickup. In other cases, coarse alignment of the die bond region may be performed after die pickup.

Pre-alignment inspection is performed at 1020. For example, the camera module is extended for pre-alignment inspection. For example, the lookup camera and lookdown camera of the camera module inspect the bottom of the die, the edges of the die and the bonding region of the alignment carrier. The pre-alignment inspection determines the offset and target bond position based on the local carrier fiducials, as previously described. The offset and positions of the local carrier fiducials may be stored in the system memory. In addition, an alignment offset may also be stored in memory.

After pre-alignment, die alignment is performed at 1025. Die alignment includes aligning the die to the target bond position. Alignment includes positioning the bonding head and camera module so that the die is aligned to the target bond position on the die attach region, both in the x and y directions and also rotationally. Once the die is aligned to the target bond position, the camera module is retracted to expose the die attach region on the carrier. The bonding assembly is actuated to move the bonding head vertically to attach the die to the die attach region on the alignment carrier at 1030.

At 1040, the system determines if the bonded die is to be post bond inspected. If the bonded die is earmarked for post bond inspection, post bond inspection is performed. If not, the process proceeds to 1060. Post bond inspection is performed at 1045. Post bond inspection, for example, includes extending the camera module for the lookdown camera to inspect the carrier with the bonded die. The camera may inspect the die bond region based on the local carrier fiducials if visible or based on the recalled positions of the local carrier fiducials if not visible to determine the target bond region and the die outline to determine the die position based on the offset stored in the system memory.

The post bond inspection, for example, determines whether the distance (post bond inspection offset) of the first die reference point from the target bond position (including the alignment offset retrieved from memory) is less than or equal to a post bond inspection offset threshold. If the post bond inspection offset exceeds the threshold, then post bond inspection has failed. The process proceeds to 1050 and the image of the post bond inspection is saved for failure analysis. The process then proceeds to 1060. If the post bond inspection offset is equal to or less than the threshold, then post bond inspection has passed and the process continues to 1060.

At 1060, the system determines if there are more dies to bond. For example, in the case where the carrier is segmented into blocks, the system determines if there are more dies to bond for the block. If there are, the process proceeds to 1065 and sets up the system for the next die position on the carrier. The process then continues to 1015. If there are no more dies to bond for the block, the process proceeds to 1070 to determine if there are more blocks on the carrier for die bonding. If there are, the process proceeds to 1075 and sets up the system for the first die position of the next block. The process then continues to 1015. If no more blocks are needed to be bonded, the process terminates at 1080.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

The invention claimed is:

1. A method for post bond inspection comprising:
providing a carrier with die bond regions, wherein a die bond region includes local carrier fiducials from which a target bond position of the die bond region is derived;
providing a selected die for bonding to a selected die bond region of the die bond regions on the carrier, wherein an active surface of the selected die is bonded to the selected die bond region;
aligning the selected die to the target bond position on the selected die bond region, wherein aligning the selected die to the target bond position comprises
determining the target bond position based on local carrier fiducials of the selected die bond region,
determining a die reference point on the active surface of the selected die, wherein the die reference point is a virtual point,
determining a reference point offset for the die reference point, and
aligning the die reference point to the target bond position;
bonding the selected die (bonded die) to the die bond region after the selected die is aligned to the target bond position; and
performing a post bond inspection on the bonded die, wherein the post bond inspection comprises
determining the target bond position based on the local carrier fiducials of the selected die bond region,
determining a post bond die reference point based on a bonded position of the die (bonded die position) and the reference point offset, and
determining if the post bond die reference point is aligned to the target bond position.

2. The method of claim 1 wherein determining the die reference point comprises determining a plurality of die reference points.

3. The method of claim 2 wherein the plurality of die reference points are offset by a die reference point offset.

4. The method of claim 1 wherein determining the target bond position comprises determining a carrier reference point based on the local carrier fiducials.

5. The method of claim 4 wherein determining the carrier reference point comprises determining a plurality of carrier reference points.

6. The method of claim 5 wherein the plurality of carrier reference points are offset by a carrier reference point offset.

7. The method of claim 1 wherein:
determining the die reference point comprises
identifying first die fiducials on the active surface of the selected die, and
calculating the die reference point based on the first die fiducials; and
determining the reference point offset comprises
identifying second die fiducials on edges of the selected die,
calculating a second die reference point based on the second die fiducials, and
wherein the reference point offset is an offset between the die reference point and the second die reference point.

8. The method of claim 1 wherein determining the reference point offset comprises:
identifying first die fiducials on the active surface of the selected die;
identifying second die fiducials on edges of the selected die; and
wherein the reference point offset is an offset between the first and second die fiducials.

9. The method of claim 1 wherein:
determining the die reference point comprises
identifying first die fiducials on the active surface of the selected die, and
calculating the die reference point based on the first die fiducials; and
determining the reference point offset comprises
identifying second die fiducials on edges of the selected die, and
wherein the reference point offset is an offset between the die reference point and the second die fiducials.

10. The method of claim 1 wherein determining the reference point offset comprises:
identifying first fiducials on the active surface of the selected die;

identifying second die fiducials on edges of the selected die;
calculating a second die reference point based on the second die fiducials; and
wherein the reference point offset is an offset between the second die reference point and first die fiducials.

11. A post bond inspection system for a die bonder comprising:
an integrated camera module configured
to view downwards in a vertical direction for detecting local carrier fiducials of a selected die bond region of an alignment carrier when the alignment carrier is mounted on a base assembly of the die bonder, wherein the alignment carrier includes die bond regions and each die bond region includes local carrier fiducials from which a target bond position is determined, and
to view upwards in the vertical direction for viewing an active (bottom) surface including die fiducials of a selected die, wherein a die reference point is determined from the die fiducials; and
a processor, the processor receives input from the camera module, the processor is configured to perform an inspection including a post bond inspection comprising
determining the target bond position based on the local carrier fiducials of the selected die bond region,
retrieving, from a memory storage, a reference point offset determined for the die reference point during die aligning,
deriving a post bond die reference point based on a bonded position of the die (bonded die position) and the reference point offset, and
determining if the post bond die reference point is aligned to the target bond position.

12. The system of claim 11 wherein the processor is configured to perform the inspection including a pre bond inspection to align the selected die to the target bond position on the selected die bond region, wherein the pre bond inspection comprises
determining the target bond position based on the local carrier fiducials of the selected die bond region,
determining the die reference point on the active surface of the selected die, and
determining the reference point offset for the die reference point, wherein the reference point offset is stored in the memory storage for retrieval.

13. The system of claim 12 wherein determining the die reference point comprises determining a plurality of die reference points.

14. The system of claim 13 wherein the plurality of die reference points are offset by a die reference point offset.

15. The system of claim 12 wherein determining the target bond position comprises determining a carrier reference point based on the local carrier fiducials, wherein the carrier reference point comprises a plurality of carrier reference points.

16. The system of claim 15 wherein the plurality of carrier reference points are offset by a carrier reference point offset.

17. The system of claim 12 wherein:
determining the die reference point comprises
identifying first die fiducials on the active surface of the selected die, and
calculating the die reference point based on the first die fiducials; and
determining the reference point offset comprises
identifying second die fiducials on edges of the selected die,
calculating a second die reference point based on the second die fiducials, and
wherein the reference point offset is an offset between the die reference point and the second die reference point.

18. The system of claim 12 wherein determining the reference point offset comprises:
identifying first die fiducials on the active surface of the selected die;
identifying second die fiducials on edges of the selected die; and
wherein the reference point offset is an offset between the first and second die fiducials.

19. The system of claim 12 wherein:
determining the die reference point comprises
identifying first die fiducials on the active surface of the selected die, and
calculating the die reference point based on the first die fiducials; and
determining the reference point offset comprises
identifying second die fiducials on edges of the selected die, and
wherein the reference point offset is an offset between the die reference point and the second die fiducials.

20. The system of claim 12 wherein determining the reference point offset comprises:
identifying first fiducials on the active surface of the selected die;
identifying second die fiducials on edges of the selected die;
calculating a second die reference point based on the second die fiducials; and
wherein the reference point offset is an offset between the second die reference point and first die fiducials.

* * * * *